(12) United States Patent
Yamagata et al.

(10) Patent No.: US 7,371,470 B2
(45) Date of Patent: *May 13, 2008

(54) PYRAN DERIVATIVE

(75) Inventors: Sachiko Yamagata, Kanagawa (JP); Hiroko Abe, Tokyo (JP); Nobuharu Ohsawa, Kanagawa (JP); Ryoji Nomura, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/732,637

(22) Filed: Apr. 4, 2007

(65) Prior Publication Data

US 2007/0184304 A1    Aug. 9, 2007

Related U.S. Application Data

(63) Continuation of application No. 10/968,778, filed on Oct. 19, 2004, now Pat. No. 7,217,465.

(30) Foreign Application Priority Data

Oct. 27, 2003    (JP)    ............................. 2003-366706

(51) Int. Cl.
    *B32B 9/00*    (2006.01)

(52) U.S. Cl. ...................... 428/690; 428/917; 313/504; 313/506; 257/102; 257/E51.031

(58) Field of Classification Search .............. 428/690, 428/917; 313/504, 506; 252/301.16; 549/415, 549/426; 546/94, 98; 257/102, E51.031
See application file for complete search history.

(56) References Cited

U.S. PATENT DOCUMENTS 4,146,707 A    3/1979    Van Allan et al. .......... 542/433

(Continued)

FOREIGN PATENT DOCUMENTS

JP    2814435    10/1998

(Continued)

OTHER PUBLICATIONS

English translation of Office Action, Chinese Patent Application No. 20040068600, dated Jun. 29, 2007.

(Continued)

*Primary Examiner*—Callie Shosho
*Assistant Examiner*—Carrie S. Thompson
(74) *Attorney, Agent, or Firm*—Cook, Alex, McFarron, Manzo, Cummings & Mehler, Ltd.

(57) ABSTRACT

A light-emitting compound that can be easily applied to vacuum vapor deposition and exhibit long wavelength light is disclosed. Further, a light-emitting element without inferior luminescence properties due to the carbonization of a light-emitting compound during vapor deposition; and a light-emitting device that is composed of the light-emitting elements are also disclosed. A pyran derivative is represented by the following general formula 1:

[general formula 1]

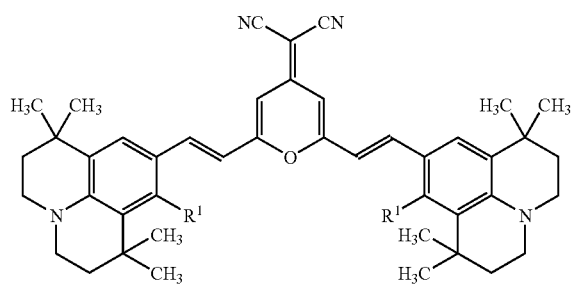

(1)

wherein $R^1$ is a hydrogen element or an alkoxy group.

21 Claims, 17 Drawing Sheets

U.S. PATENT DOCUMENTS

| | | | |
|---|---|---|---|
| 4,769,292 A | 9/1988 | Tang et al. | 428/690 |
| 6,649,089 B2 | 11/2003 | Chang et al. | 252/301.06 |
| 6,680,132 B2 | 1/2004 | Shi et al. | 428/690 |
| 7,217,465 B2 * | 5/2007 | Yamagata et al. | 428/690 |
| 2003/0165714 A1 | 9/2003 | Lee et al. | 428/690 |
| 2005/0048315 A1 | 3/2005 | Yamagata et al. | 428/690 |

FOREIGN PATENT DOCUMENTS

| | | |
|---|---|---|
| JP | 2001-19946 | 1/2001 |
| KR | 2003-0042284 | 5/2003 |

OTHER PUBLICATIONS

Jung, B.J. et al., "Pure-Red Dye for Organic Electroluminescent Devices: Bis-Condensed DCM Derivatives," Advanced Functional Materials, vol. 11, No. 6, (2000), pp. 430-434.

* cited by examiner

PYRAN DERIVATIVE

This application is a continuation of U.S. application Ser. No. 10/968,778, filed on Oct. 19, 2004 now U.S. Pat. No. 7,217,465.

BACKGROUND OF THE INVENTION

1. Field of the Invention

The present invention relates to a pyran derivative, and more particularly such a pyran derivative that exhibits long wavelength light. Further, the present invention relates to a light-emitting element containing the pyran derivative.

2. Related Art

A light-emitting device utilizing light emission from an electroluminescent element (light-emitting element) has attracted attention as a device for lighting or displaying an image.

In recent years, in the development area for a light-emitting device, the research and development of a light-emitting device capable of displaying a high quality full color image has been accelerated to secure a market of display devices for various information-processing devices such as a TV set or a car navigation system In order to obtain full color image from a light-emitting device, it is required that regions exhibiting respectively at least three primary colors of red (R), green (G) and blue (B) are independently provided so as to emit light at the right time.

Various methods have been developed to provide the foregoing regions for exhibiting three primary colors. One method for providing the foregoing regions is forming layers, each of which contains light-emitting compounds displaying different colors, at different sites, thereby providing light-emitting elements each containing one of the layers independently.

In case of using the foregoing method, light-emitting compounds are required to be selected for the respective emission colors. Therefore, light-emitting materials that exhibit light emission over various wavelength ranges have been developed.

For example, as a material exhibiting reddish emission, a bis-4H-pyran derivative as disclosed in Japanese Published Unexamined Patent Application No. 2001-19946 has been developed.

However, some of the bis-4H-pyran derivative disclosed in Japanese Published Unexamined Patent Application No. 2001-19946 are difficult to be formed into a film by vacuum vapor deposition since they are easily carbonized during vapor deposition.

In the case that such light-emitting material as are easily carbonized is used, a tarry substance is liable to be attached to an evaporation source. Accordingly, the exchange frequency of an evaporation sources is increased. As a result, there arises a problem that more light-emitting material for deposition is needed, and so the efficiency in the use of the material becomes worse. Further, there may arise another problem that good luminescence properties cannot be obtained due to a carbonized light-emitting material, or the like.

Therefore, it has been required to develop a light-emitting material that is not only be able to exhibit light emission with good luminescence properties, but also be easily applied to vacuum vapor deposition.

SUMMARY OF THE INVENTION

It is an object of the present invention to provide a light-emitting compound that can be easily applied to vacuum vapor deposition and exhibits long wavelength light. A further object of the present invention is to provide a light-emitting element without inferior luminescence properties due to the carbonization of a light-emitting compound during vapor deposition; and a light-emitting device that includes the light-emitting elements.

A light-emitting compound and a light-emitting element according to the present invention are explained hereinafter. As used herein, the term "light-emitting compound" refers to a compound, which has a substituent with luminescent properties in a skeleton, and which can radiate energy as light.

One aspect of the present invention is a pyran derivative represented by the following general formula 1.

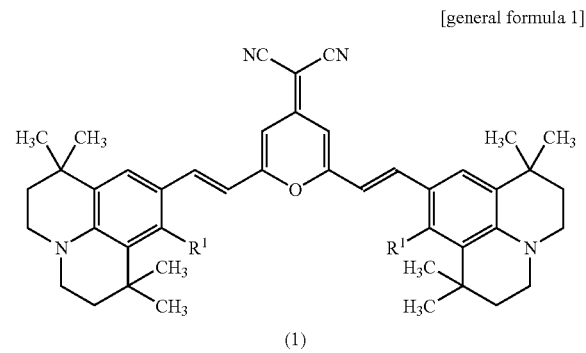

[general formula 1]

(1)

wherein $R^1$ is a hydrogen element or an alkoxy group.

The above described pyran derivative according to the present invention exhibits long wavelength light of from 560 to 780 nm. The pyran derivative is a substance that is easily sublimed at lower temperature than that of the conventional pyran derivative. Specifically, from the relationship between weight and temperature by TG-DTA measurement, the pyran derivative is the substance whose weight reaches 50% or less at 450° C. or less at normal pressures compared to the weight at the beginning of a weight loss. Further, the pyran derivative is the substance whose weight reaches 50% or less compared to the weight at the beginning of a weight loss within the temperature difference of 100° C. or less.

Another aspect of the present invention is a light-emitting element using a pyran derivative according to the present invention represented by any one of the foregoing general formula 1, structural formula 2, or structural formula 3.

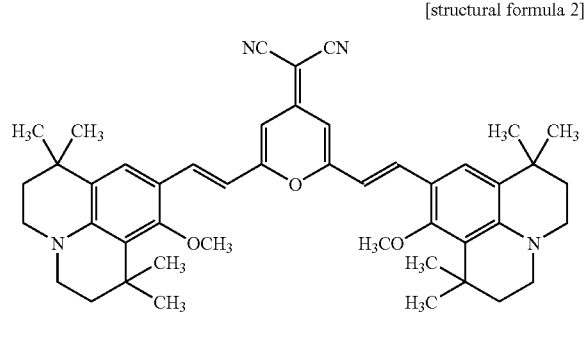

[structural formula 2]

(2)

-continued

[structural formula 3]

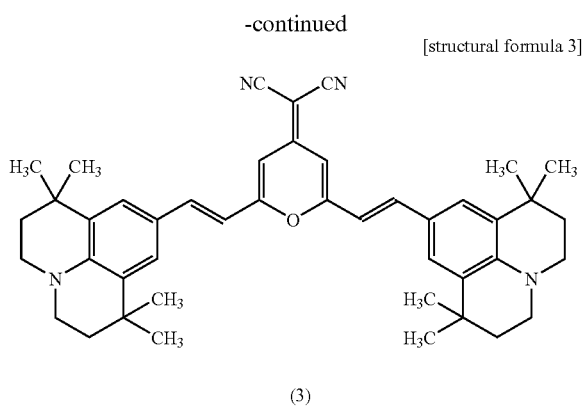

(3)

A pyran derivative according to the present invention can be used for a light-emitting element by itself or by combining with a substance having high carrier transportation properties.

As a light-emitting element, a light-emitting element having the configuration in which a plurality of layers are interposed between a pair of electrodes can be nominated as a representative example. As used herein, the term "a plurality of layers" refers to layers that include a pyran derivative according to the present invention, and that are formed by a layer containing a substance having high carrier (hole and electron) injection properties or a substance having high carrier (hole and electron) transportation properties. Further, within the light-emitting element according to the present invention, a pyran derivative according to the invention may be included independently in the state of a layer, or in the state of a mixed layer with a substance having high carrier transportation properties.

However, the configuration of the light-emitting element is not limited to the above described one. For example, the light-emitting element may be formed to have the configuration in which only a mixed layer containing a pyran derivative according to the present invention and a substance having high carrier transportation properties is interposed between a pair of electrodes.

A light-emitting element using a pyran derivative according to the present invention exhibits long wavelength light of from 560 to 780 nm, and can be applied to a light-emitting device as a light-emitting element exhibiting reddish light emission.

As mentioned above, a pyran derivative according to the present invention is hardly carbonized during vapor deposition and can be easily formed into a film by vacuum vapor deposition. Accordingly, a pyran derivative according to the present invention can be efficiently used as a material, and a light-emitting element and a light-emitting device using the pyran derivative enabling low cost fabrication can be provided. Since the light-emitting compound is hardly carbonized, a light-emitting element and a light-emitting device including the light-emitting elements without inferior luminescent properties due to the carbonization.

According to the present invention, a light-emitting compound that can be easily applied to vacuum vapor deposition, and that can exhibit long wavelength light can be obtained.

According to the present invention, the low efficiency in the use of a material due to the carbonization of a light-emitting compound can be prevented, and a light-emitting element enabling low cost fabrication and a light-emitting device including the light-emitting elements can be obtained.

According to the present invention, a light-emitting element without inferior luminescent properties due to the carbonization of a light-emitting compound can be obtained. A light-emitting device that can display good images by including the light-emitting elements can be obtained.

These and other objects, features and advantages of the present invention will become more apparent upon reading of the following detailed description along with the accompanied drawings.

DESCRIPTION OF THE INVENTION

Embodiment 1

A pyran derivative represented by structural formula 2 or 3 is a specific example of a pyran derivative represented by general formula 1.

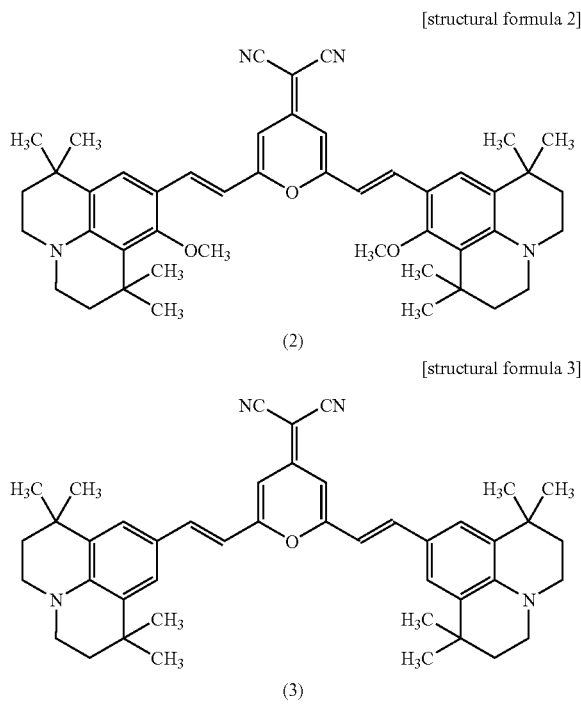

[structural formula 2]

(2)

[structural formula 3]

(3)

A pyran derivative represented by structural formula 2 is a pyran derivative represented by general formula 1 wherein $R^1$ is substituted by an alkoxy group.

A pyran derivative represented by structural formula 3 is a pyran derivative represented by general formula 1 in which $R^1$ is substituted by a hydrogen element.

A pyran derivative according to the present invention represented by the foregoing structural formulae 2, 3 exhibits long wavelength light of from 560 to 780 nm. The pyran derivative is a substance that is easily sublimed at lower temperature than that of the conventional pyran derivative. Specifically, from the relationship between weight and temperature by TG/-DTA measurement, the pyran derivative is the substance whose weight reaches 50% or less compared to the weight at the beginning of weight loss at 450° C. or less at normal pressures. Further, the pyran derivative is the substance whose weight reaches 50% or less to compared to the weight at the beginning of weight loss within the temperature difference of 100° C. or less.

Embodiment 2

One embodiment of a light-emitting element using a pyran derivative according to the present invention is explained. The configuration of the light-emitting element is not limited to that mentioned below.

Figure 1A:
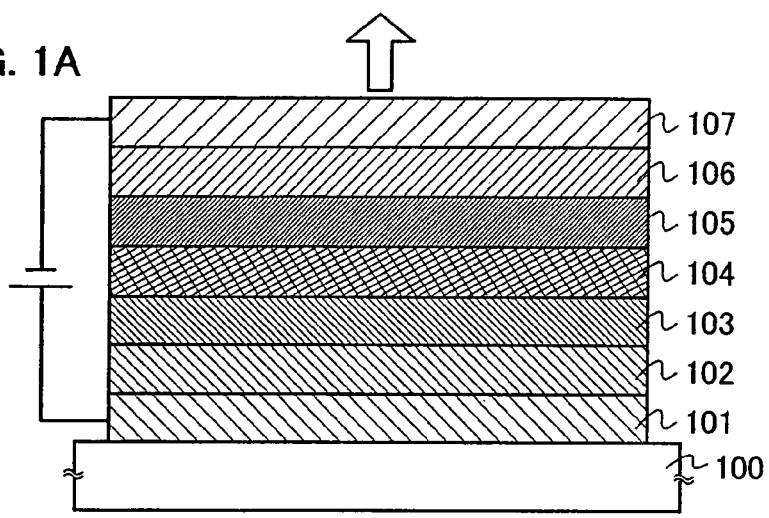
FIGS. 1A to 1C are explanatory views for showing a layer configuration of a light-emitting element according to certain aspects of the present invention.
Figure 1B:
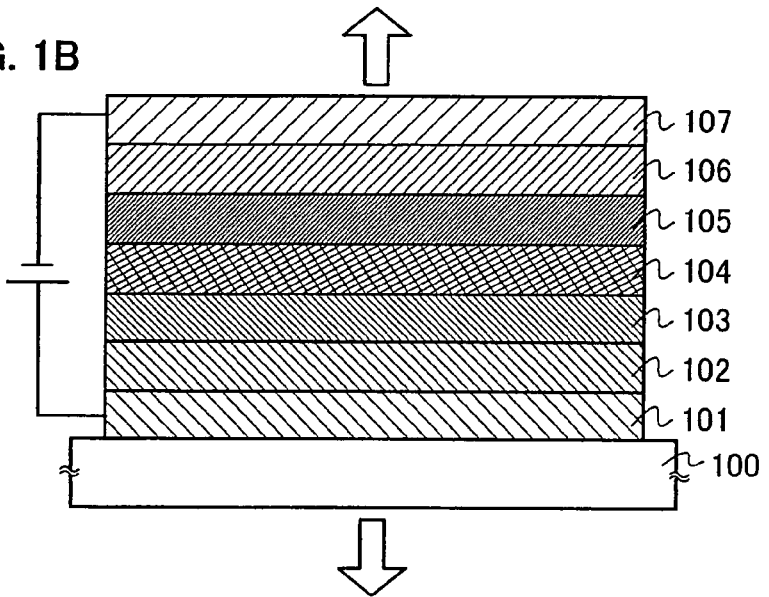
Figure 1C:
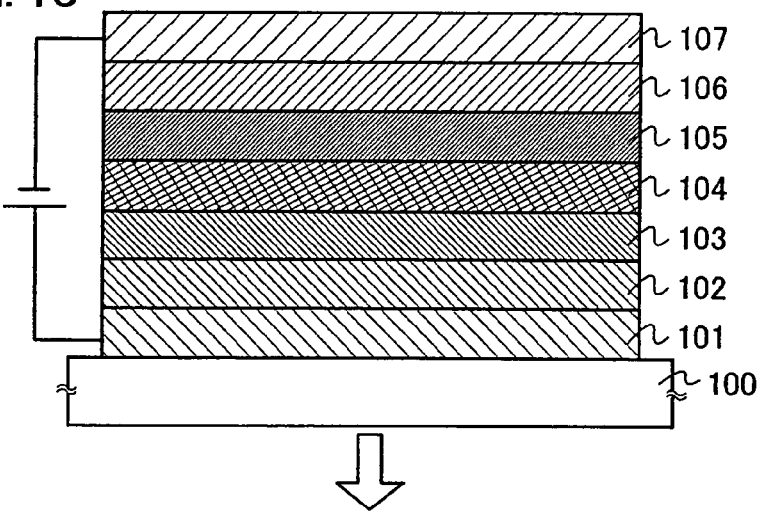

As shown in FIGS. 1A to 1C, a light-emitting element according to the present invention is composed of a first electrode 101, a plurality of layers (a first layer 102, a second layer 103, a third layer 104, a fourth layer 105, and a fifth layer 106) formed sequentially over the first electrode 101, and a second electrode 107 formed over the fifth layer 106. Further, the light-emitting element is manufactured over a substrate 100 in this embodiment. In addition, the first electrode 101 serves as an anode, and the second electrode 107 serves as a cathode in this embodiment.

As a material for the substrate 100, plastic or the like with flexibility can be used besides glass or quartz. Another material can be used as the substrate 100 as long as it serves as a support medium for the light-emitting element during a process for manufacturing the light-emitting element.

The first electrode 101 is preferably formed by metals having large work functions (at least 4.0 eV), alloys, compounds having electrical conduction properties, and mixture of the foregoing materials. Specifically, ITO (indium tin oxide), ITO containing silicon, IZO (indium zinc oxide) composed of indium oxide mixed with zinc oxide (ZnO) of from 2 to 20%, aurum (Au), platinum (Pt), nickel (Ni), tungsten (W), chromium (Cr), molybdenum (Mo), ferrum (Fe), cobalt (Co), copper (Cu), palladium (Pd), nitrides of metal materials such as (TiN), or the like can be used. The first electrode 101 may be formed by a material that can be deposited by sputtering. It is not limited to the foregoing materials, another material can be used.

The first layer 102 is formed by a substance having high hole injection properties. For example, the first layer 102 is a layer formed by metal oxides such as molybdenum oxides (MoOx), vanadium oxides (VOx), ruthenium oxides (RuOx), tungsten oxides (WOx), manganese oxides (MnOx), or the like. Besides, a phthalocyanine based compound such as phthalocyanine (abbreviated $H_2Pc$), copper phthalocyanine (CuPc); or a high molecular weight material such as poly(ethylene dioxythiophene)/poly(styrene sulfonate) solution (PEDOT/PSS), each of which is a substance having high hole injection properties, can be used as a material for the first layer 102. It is not limited to the foregoing materials described in Embodiment 2, another material can be used.

The second layer 103 is formed by a substance having high hole transportation properties, for example, aromatic amine (that is, the one having a benzene ring-nitrogen bond) based compounds such as 4,4'-bis[N-(1-naphthyl)-N-phenyl-amino]-biphenyl (abbreviated α-NPD), 4,4'-bis[N-(3-methylphenyl)-N-phenyl-amino]-biphenyl (abbreviated TPD), 4,4',4"-tris(N,N-diphenyl-amino)-triphenyl amine (abbreviated TDATA), and 4,4',4"-tris[N-(3-methylphenyl)-N-phenyl-amino]-triphenylamine (abbreviated MTDATA). It is not limited to the foregoing materials in Embodiment 2, another material can be used.

The third layer 104 is a layer containing a pyran derivative according to the present invention. The third layer 104 may be a mixed layer composed of a pyran derivative represented by any one of general formula 1, structural formula 2, and structural formula 3; and a substance having high carrier transportation properties such as tris(8-quinolinolato)aluminum (abbreviated $Alq_3$), 9,10-di(2-naphtyl)anthracene (abbreviated DNA), or the like. Further, the third layer 104 may be deposited by co-evaporation of a pyran derivative according to the present invention and a substance having high carrier transportation properties.

The fourth layer 105 is formed by a substance having high electron transportation properties, for example, a metal complex having a quinoline skeleton or a benzoquinoline skeleton such as tris(8-quinolinolate) aluminum (abbreviated $Alq_3$), tris(5-methyl-8-quinolinolate) aluminum (abbreviated $Almq_3$), bis(10-hydroxybenzo[h]-quinolinolate) beryllium (abbreviated $BeBq_2$), or bis(2-methyl-8-quinolinolate)-4-phenylphenolate-aluminum (abbreviated BAlq). Alternatively, a metal complex having an oxazole based or thiazole based ligand such as bis [2-(2-hydroxyphenyl)-benzooxazolate] zinc (abbreviated $Zn(BOX)_2$), or bis [2-(2-hydroxyphenyl)-benzothiazolate] zinc (abbreviated $Zn(BTZ)_2$). In addition to the metal complex, 2-(4-biphenyl)-5-(4-tert-butylphenyl)-1,3,4-oxadiazole (abbreviated PBD), 1,3-bis[5-(p-tert-butylphenyl)-1,3,4-oxadiazole-2-yl] benzene (abbreviated OXD-7), 3-(4-tert-butylphenyl)-4-phenyl-5-(4-biphenylyl)-1,2,4-triazole (abbreviated TAZ), 3-(4-tert-butylphenyl)-4-(4-ethylphenyl)-5-(4-biphenylyl)-1,2,4-triazole (abbreviated p-EtTAZ), bathophenanthroline (abbreviated BPhen), bathocuproin (abbreviated BCP), or the like can be used. It is not limited to the foregoing materials in Embodiment 2, another material can be used.

The fifth layer 106 is a layer formed by a material having high electron injection properties, such as a compound of an alkali metal or an alkali earth metal such as lithium fluoride (LiF), cesium fluoride (CsF), calcium fluoride ($CaF_2$), or the like. Alternatively, the fifth layer 106 may be a layer formed by combining a substance having high electron transportation properties, and an alkali metal or an alkali earth metal. For example, the fifth layer 106 may contain $Alq_3$ and magnesium (Mg). It is not limited to the foregoing materials, another material can be used.

The second electrode 107 is preferably formed by metals, alloys, compounds having electrical conduction properties, having small work functions (at most 3.8 eV), mixture of the foregoing materials, or the like. Specifically, an element of group 1 or 2 of the periodic table, that is, an alkali metal such as lithium (Li), cesium (Cs), or the like; alkali earth metal such as magnesium (Mg), calcium (Ca), strontium (Sr), or the like; and alloys including the metals and aluminum, silver, and the like (Mg:Ag, Al:Li) can be used. In the case that a layer for promoting electron injection is formed between the first electrode 101 and the second electrode 107 so as to be formed on the second electrode 107, the second electrode 107 can be formed by conductive materials such as Al, Ag, ITO, or ITO containing silicon regardless of level of the work functions. It is not limited to the foregoing materials, another material can be used.

Within a light-emitting element according to the invention having the foregoing configuration, a current is flowed due to an electric potential difference generated between the first electrode 101 and the second electrode 107, and holes and electrons are recombined with each other within the third layer 104, which is a layer containing a pyran derivative according to the present invention, then, light is generated. Therefore, a light-emitting region is formed in the third layer 104.

Light is emitted to the outside passing through either the first electrode 101 or the second electrode 107, or both of them. Therefore, either the first electrode 101 or the second electrode 107, or both of them are formed by a substance having light-transmitting properties.

In the case that both the first electrode 101 and the second electrode 107 are formed by substances having light-transmitting properties, light is emitted from both the substrate and the opposite side of the substrate passing through the first electrode 101 and the second electrode 107 as shown in FIG. 1B. In the case that only the second electrode 107 is formed by a substance having light-transmitting properties, and in the case that both the first electrode 101 and the second electrode 107 are formed by substances having light-transmitting properties, and a reflective film is provided at the side of the first electrode 101; light is emitted from the opposite side of the substrate passing through the second electrode 107 as shown in FIG. 1A. In the case that only the first electrode 101 is formed by a substance having light-transmitting properties, and in the case that both the first electrode 101 and the second electrode 107 are formed by substances having light-transmitting properties, and a reflective film is provided at the side of the second electrode 107; light is emitted from the side of the substrate passing through the first electrode 101 as shown in FIG. 1C.

The structure of layers formed between the first electrode 101 and the second electrode 107 are not limited to the above described structure. Any other layer structure than the foregoing ones may be applicable as long as the structure is formed to have an area for the recombination of holes and electrons located away from the first electrode 101 and the second electrode 107 to prevent quenching due to adjacency between a light-emitting region and a metal. The lamination structure of the layer is not restricted especially. The layer may be formed by combining appropriately a layer containing a pyran derivative according to the present invention with one or two or more layers containing a substance having high electron transportation properties, a substance having hole transportation properties, a substance having electron injection properties, a substance having hole injection properties, a substance having bipolar properties (high electron or hole transportation properties), or the like. Further, there may be same kinds of substances in the layer between the pair of electrodes. For example, a substance combined with a pyran derivative for forming a layer containing a pyran derivative according to the present invention, and a substance having high electron transporting properties for forming the fourth layer 105 may be the same.

The light-emitting element is manufactured by forming sequentially the first electrode 101, the first layer 102, the second layer 103, the third layer 104, the fourth layer 105, the fifth layer 106, and the second electrode 107, over the substrate 100. Further, a method for forming each of the layers is not especially limited. These layers are preferably formed by any one of vapor deposition, ink jetting, and spin coating. In this embodiment, the layer containing a pyran derivative according to the present invention is formed by vapor deposition.

Figure 2:
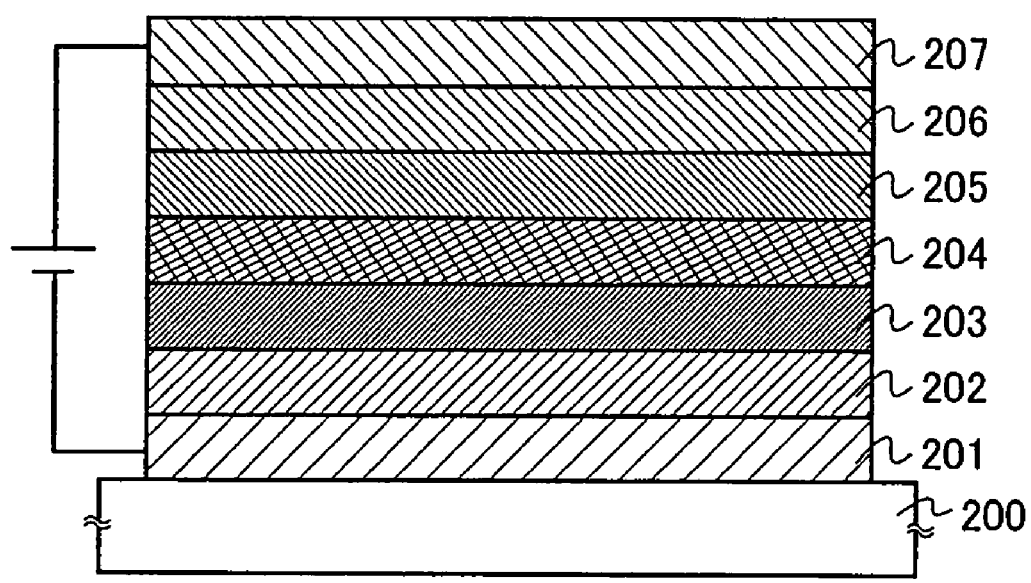
FIG. 2 is an explanatory view for showing a layer configuration of a light-emitting element according to certain aspects of the present invention.

FIG. 2 is a view for showing one embodiment of a light-emitting element according to the present invention that has a different configuration from that described above. In FIG. 2, a first electrode 201 is formed over a substrate 200. A first layer 202, a second layer 203, a third layer 204, a fourth layer 205, and a fifth layer 206 are sequentially formed over the first electrode 201. Moreover, a second electrode 207 is formed over the fifth layer 206.

The first layer 202 is formed by a substance having high electron injection properties. The second layer 203 is formed by a substance having high electron transportation properties. The third layer 204 contains a pyran derivative according to the present invention. The fourth layer 205 is formed by a substance having high hole transportation properties. The fifth layer 206 is formed by a substance having high hole injection properties. Within thus formed light-emitting element, the first electrode 201 serves as a cathode, and the second electrode 207 serves as an anode. The light-emitting element shown in FIG. 2 is one embodiment of a light-emitting element according to the present invention. The configuration of a light-emitting element according to the present invention is not limited thereto.

Above described light-emitting element uses a pyran derivative according to the present invention that is hardly carbonized during vapor deposition and that can be deposited easily. Accordingly, the deterioration of luminescence properties due to the carbonization of light-emitting compounds, for example, the shift of light emission wavelength or the deterioration of a light-emitting element can be prevented. Further, a pyran derivative according to the present invention can be used efficiently as a material. Accordingly, the material cost for manufacturing the light-emitting element using the pyran derivative is reduced. In addition, the pyran derivative is hardly carbonized during vapor deposition, and so a light-emitting element without inferior luminescence properties due to the carbonization can be obtained.

Embodiment 3

In this embodiment, one embodiment of a light-emitting device using a light-emitting element applying the present invention is explained.

A light-emitting element is manufactured over a substrate formed by glass, plastic, or the like in Embodiment 3. A passive type display device can be manufactured by forming a plurality of such light-emitting elements over one substrate. Besides the substrate formed by glass, plastic, or the like, a light-emitting element electrically connected to a TFT can be manufactured over, for example, a thin film transistor (TFT) array substrate. Accordingly, an active matrix type display device for controlling the drive of a light-emitting element by a TFT can be manufactured. The structure of a TFT is not especially restricted. The TFT may either a staggered type TFT or an inversely staggered type TFT. With respect to a drive circuit provided to a TFT array substrate, the circuit may be formed by both an N-channel type TFT and a P-channel type TFT, or either the N-channel type TFT or the P-channel type TFT.

Therefore, good image can be obtained without inferior picture quality due to the inferior luminescent properties caused by the carbonization of light-emitting compounds by the light-emitting device composed of the light-emitting elements to which the present invention is applied. A pyran derivative according to the present invention can be efficiently used as a material, and so the material cost for the light-emitting device composed of the light-emitting elements to which the present invention is applied.

EXAMPLE 1

Synthesis Example 1

Preparation of a pyran derivative according to the present invention as represented by structural formula 2. The synthesis method is not limited to that explained in this example. A pyran derivative according to the present invention can be synthesized another method.

2.51 g (0.015 mol) of 4-(dicyanomethylene)-2,6-dimethyl-4H-pyran and 8.56 g (0.030 mol) of 1,1,7,7-tetramethyl-8-methoxyjulolidine-9-carbaldehyde synthesized by known technique were added to a three neck flask with capacity of 300 ml. Nitrogen gas stream was delivered into a system. Then, 150 ml of dehydrate acetonitrile and 1 ml of piperidine were added to the flask. The above solution containing the mixed materials were heated and refluxed for 24 hours until the reaction was completed. This process is represented by the following synthesis scheme (a).

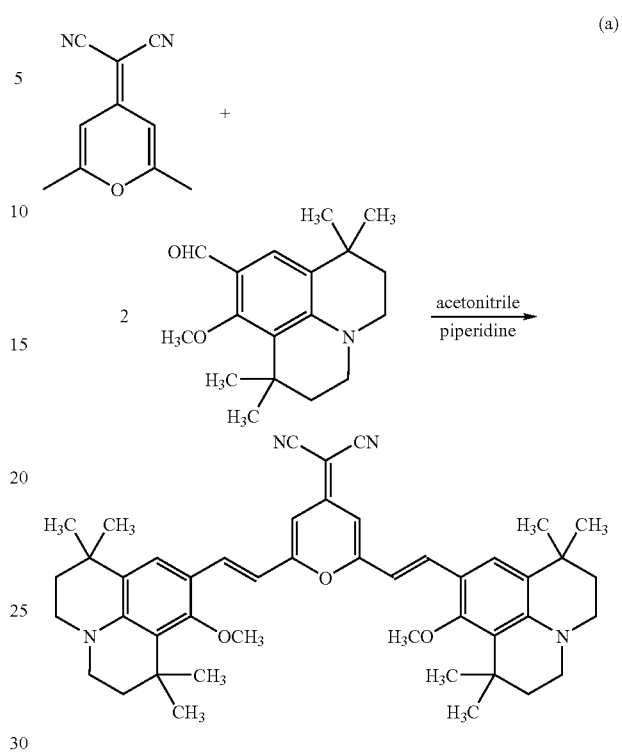

The reaction solution was cooled to room temperature, and a prepared solid was collected by suction filtration. The collected solid was recrystallized by using dichloromethane and methanol to give 7.25 g of red powder solid in a yield of 70%. The measurement condition and results of $^1$H-NMR analysis of the red powder solid are as follows. It was confirmed by the $^1$H-NMR analysis that the red powder solid was 4-(dicyanomethylene)-2,6-bis(9-[1,1,7,7-tetramethyl-8-methoxyjulolidyl])-4H-pyran.

The result of $^1$H-NMR spectrum was as follows: $^1$H-NMR (300 MHz, CDCl$_3$) δ ppm: 7.79 (d, 2H, J=15.6 Hz), 7.32 (s, 2H), 6.52 (s, 2H), 6.48 (d, 2H, J=15.6 Hz), 3.84 (s, 6H), 3.25 (t, 4H, J=6.0 Hz), 3.18 (t, 4H, J=5.4 Hz), 1.73 (m, 8H), 1.43 (s, 12H), 1.30 (s, 12H).

Figure 3:
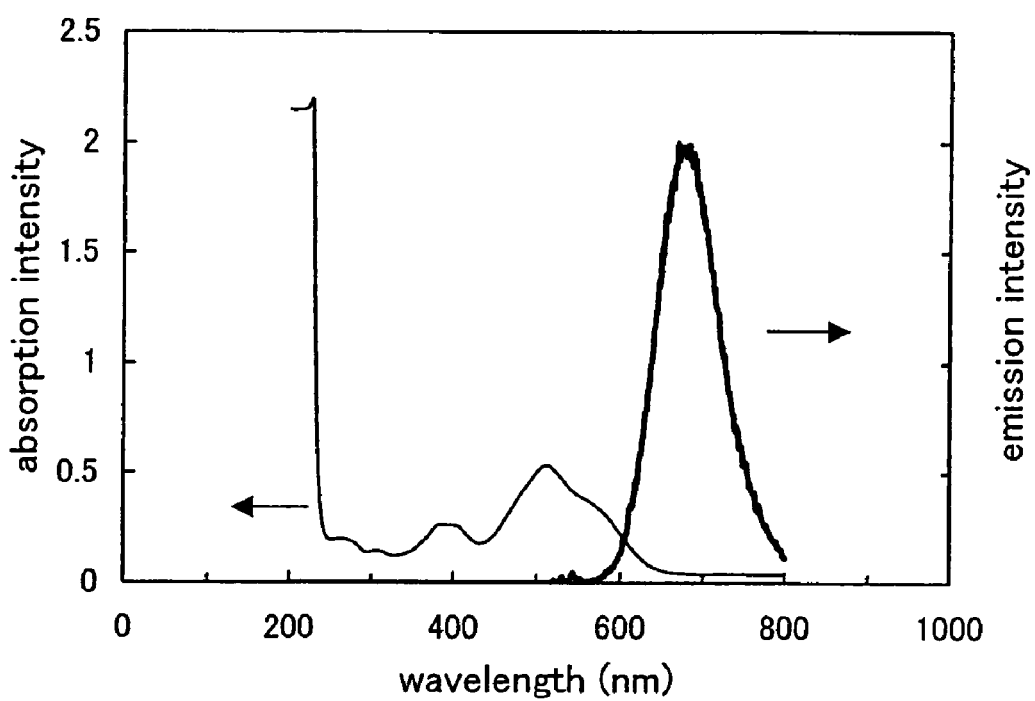
FIG. 3 is a view for showing absorption and emission spectra of a pyran derivative according to certain aspects of the present invention.

FIG. 3 is absorption and light emission spectra of 4-(dicyanomethylene)-2,6-bis(9-[1,1,7,7-tetramethyl-8-methoxyjulolidyl])-4H-pyran (abbreviated BisDCJTM) in dichloromethane solution by ultraviolet light irradiation. In FIG. 3, the longitudinal axis at left hand represents absorption intensity, the longitudinal axis at right hand represents emission intensity, and the horizontal axis represents wavelengths (nm). FIG. 3 shows that BisDCJTM in dichloromethane solution shows reddish light emission having a peak wavelength at 678 nm.

Figure 4:
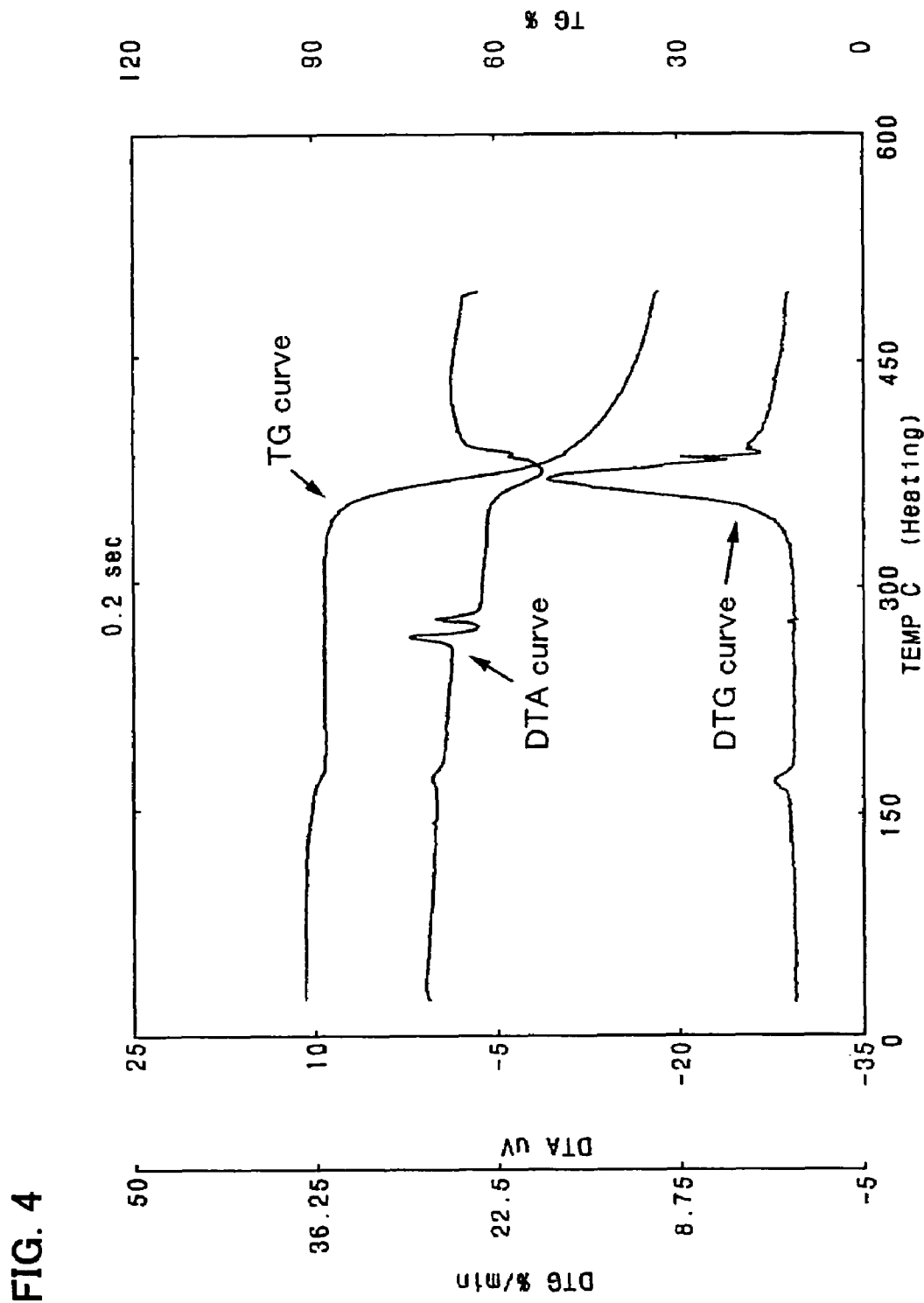
FIG. 4 is a view for showing a measurement result of a pyran derivative according to certain aspects of the present invention by TG/-DTA.

FIG. 4 shows a result of TG-DTA (Thermogravimetry-Differential Thermal Analysis) for BisDCJTM. In FIG. 4, the longitudinal axis at a left outer side represents calorie change (%/min) per unit time, the longitudinal axis at a left inner side represents differential thermal electromotive force (µV), and the longitudinal axis at a right side represents weight change (%; the weight change is based on the initial weight of 100%). The lateral axis at the bottom represents temperature (° C.), and the lateral axis at the top represents time (sec). Further, Thermo-Gravimetric/Differential Thermal Analyzer (SII NanoTechnology Inc., TG/-DTA-320) is used for the measurement.

The TG curve in FIG. 4 shows that weight reaches 50% or less to the weight at the beginning of a weight loss at 450° C. or less at normal pressures. Further, the weight reaches 50% or less to the weight at the beginning of a weight loss within the temperature difference of 50° C. or less (approximately 47° C.). The TG curve shows the beginning of the weight loss at approximately 354.5° C.

Synthesis Example 2

Preparation of a pyran derivative according to the present invention as represented by structural formula 3. The synthesis method is not limited to that explained in this example. A pyran derivative according to the present invention can be synthesized by another method.

220 mg (1.26 mmol) of 4-(dicyanomethylene)-2,6-dimethyl-4H-pyran and 730 mg (2.84 mmol) of 1,1,7,7-tetramethyljulolidine-9-carbaldehyde synthesized by known technique were added to a three neck flask with capacity of 50 ml. Nitrogen gas stream was delivered into a system. Then, 10 ml of dehydrate acetonitrile and 0.1 ml of piperidine were added to the flask. The solution containing the above mixed materials was heated and refluxed for 24 hours until the reaction was completed. This process is represented by the following synthesis scheme (b).

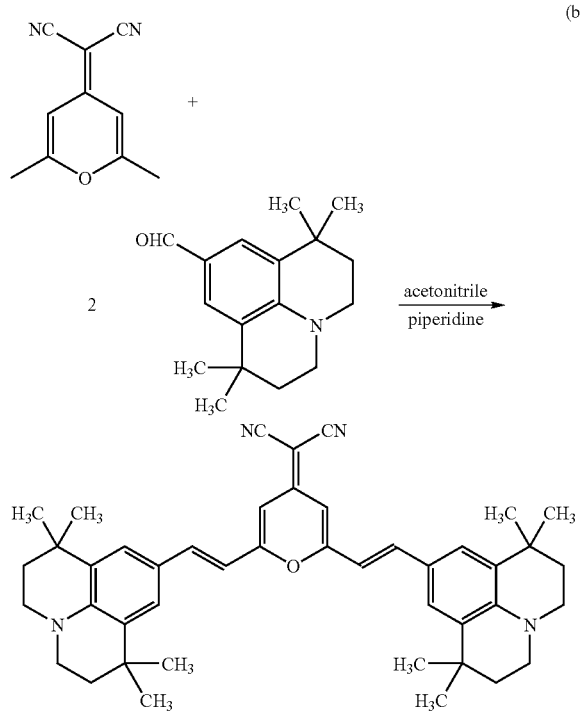

The reaction solution was cooled to room temperature, and a generated solid was collected by suction filtration. The collected solid was recrystallized by using dichloromethane and methanol to give 284 mg of red powder solid in a yield of 34%. The measurement condition and results of $^1$H-NMR of the red powder solid are as follows. It was confirmed by the $^1$H-NMR analysis that the red powder solid was 4-(dicyanomethylene)-2,6-bis(9-[1,1,7,7-tetramethyljulolidyl])-4H-pyran (abbreviated BisDCJT).

The result of $^1$H-NMR spectrum was as follows: $^1$H-NMR (300 MHz, CDCl$_3$) δ ppm: 7.42 (d, 2H, J=15.6 Hz), 7.26 (s, 4H), 6.56 (s, 2H), 6.46 (d, 2H, J=15.6 Hz), 3.28 (t, 8H, J=6.0 Hz), 1.75 (t, 8H, J=6.0 Hz), 1.32 (s, 24H).

Figure 5:
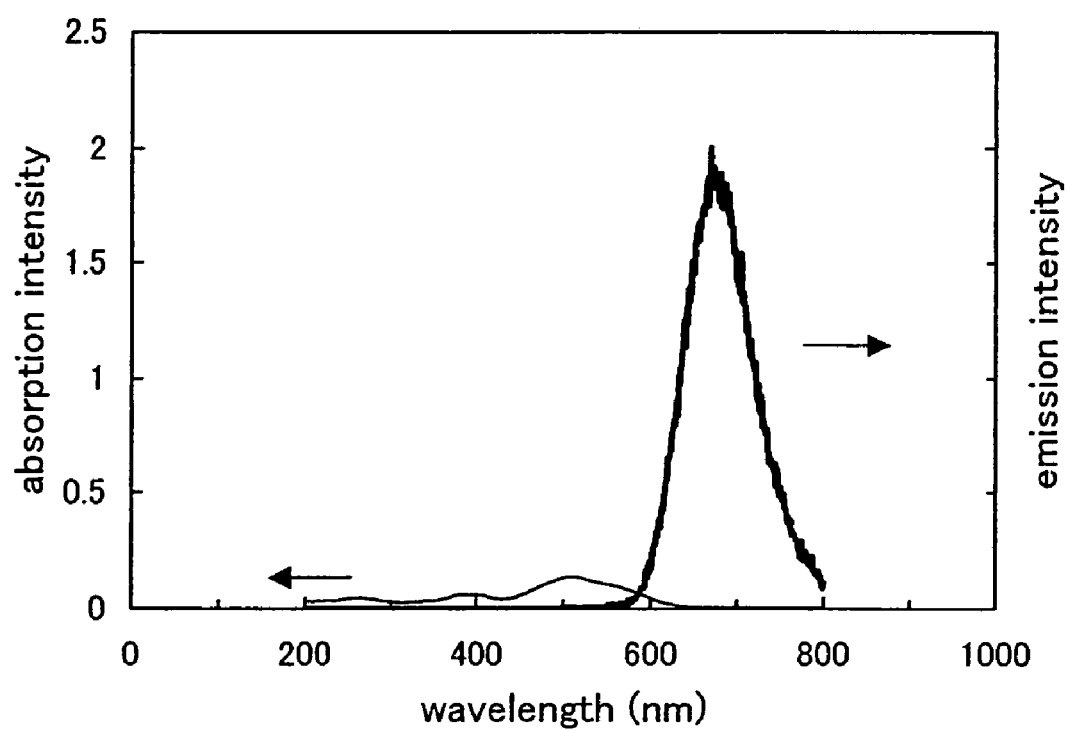
FIG. 5 is a view for showing absorption and emission spectra of a pyran derivative according to certain aspects of the present invention.

FIG. 5 is absorption and light emission spectra of BisDCJT in dichloromethane solution by ultraviolet light irradiation. In FIG. 5, the longitudinal axis at left hand represents absorption intensity, the longitudinal axis at right hand represents emission intensity, and the horizontal axis represents wavelengths (nm). FIG. 5 shows that BisDCJT in dichloromethane solution is shows reddish light emission having a peak wavelength at 676 nm.

Figure 6:
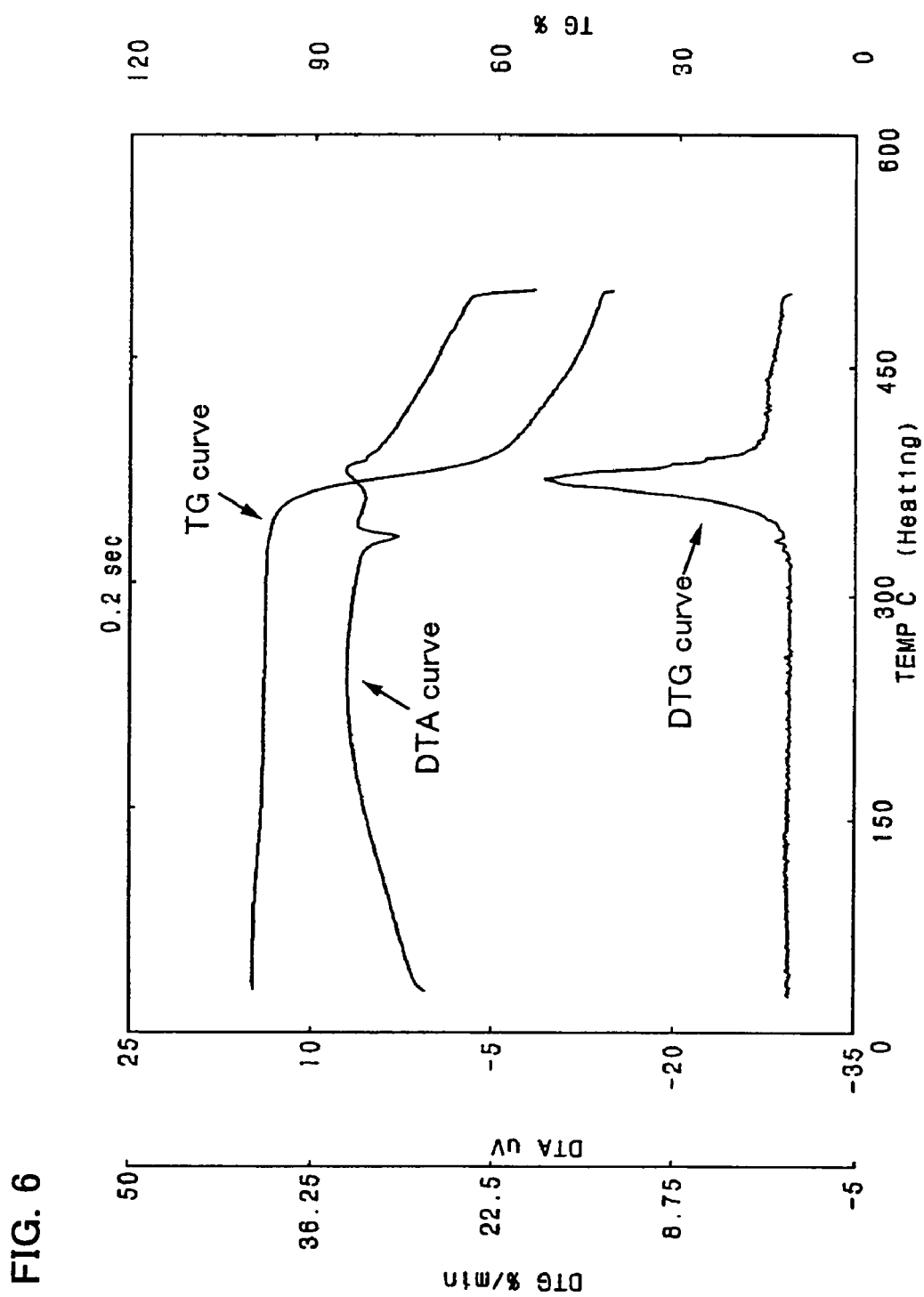
FIG. 6 is a view for showing a measurement result of a pyran derivative according to certain aspects of the present invention by TG/-DTA.

FIG. 6 shows a result of TG-DTA (Thermogravimetry-Differential Thermal Analysis) for BisDCJT. In FIG. 6, the longitudinal axis and the lateral axis show the same as those in FIG. 4. The TG curve in FIG. 6 shows that weight reaches 50% or less to the weight at the beginning of a weight loss at 450° C. or less at normal pressures. Further, the weight reaches 50% or less to the weight at the beginning of a weight loss within the temperature difference of 100° C. or less (approximately 98° C.). The TG curve in FIG. 6 shows the beginning of the weight loss at approximately 359.3° C. Further, Thermo-Gravimetric/Differential Thermal Analyzer (SII NanoTechnology Inc., TG-DTA-320) is used for the measurement.

Comparative Example

Figure 7:
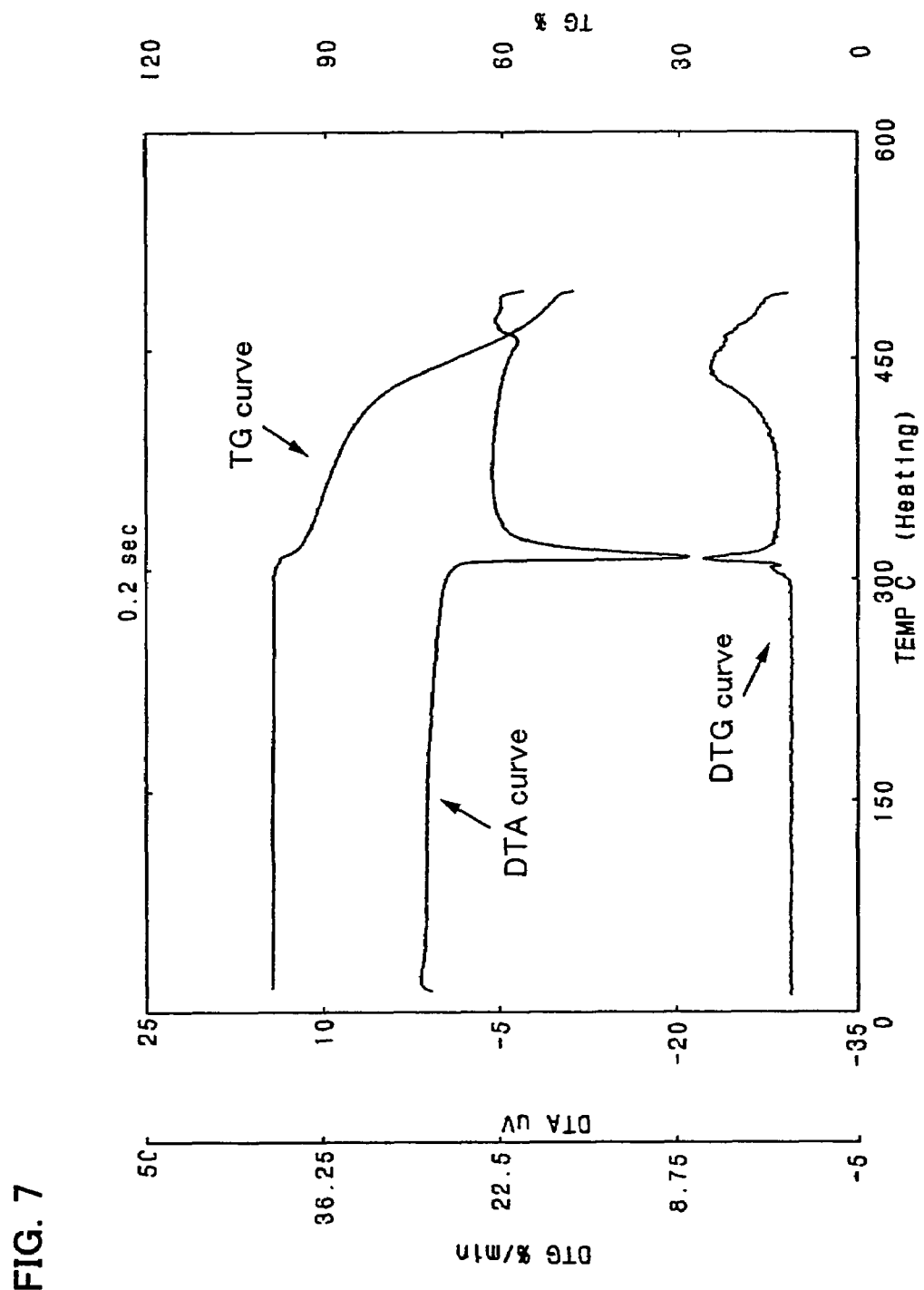
FIG. 7 is a view for showing a measurement result of a conventional pyran derivative according to by TG/-DTA.

As a comparative example of a pyran derivative of the present invention, the measurement result by TG/-DTA of 4-(dicyanomethylene)-2,6-bis(9julolidyl)-4H-pyran (abbreviated BisDCJ) that is a pyran derivative represented by the following general formula 4 is shown in FIG. 7. Thermo-Gravimetric/Differential Thermal Analyzer (SII NanoTechnology Inc., TG/DTA-320) is used for the measurement.

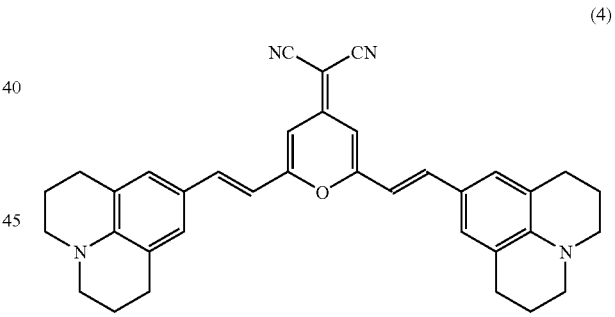

(4)

In FIG. 7, the longitudinal axis and the lateral axis show the same as those in FIG. 4. The TG curve in FIG. 7 shows that weight reaches 50% or less to the weight at the beginning of a weight loss at 500° C. or more at normal pressures. Further, the weight reaches 50% or less to the weight at the beginning of a weight loss within the temperature difference of 150° C. or more (approximately 186° C.). The TG curve in FIG. 7 shows the beginning of the weight loss at approximately 309.5° C.

As described above, the weight of the pyran derivatives according to the present invention represented by Synthesis Examples 1 and 2 reaches 50% or less to the weight at the beginning of a weight loss within the temperature difference of 100° C. or less. It is known that the pyran derivative according to the present invention is far easier to be sublimed than that described in Comparative Example. Therefore, the pyran derivative according to the present invention is superior in thermal properties, hardly carbonized during vapor deposition, and able to be efficiently used as a material.

EXAMPLE 2

In Example 2, a light-emitting element using a pyran derivative according to the present invention represented by structural formula 2 is explained. The device configuration of the light-emitting element is not limited to explained in Example 2. The light-emitting element may be formed by a different material and a different lamination structure. The light-emitting element may use a pyran derivative according to the present invention represented by structural formula 3.

ITO is deposited by sputtering over a glass substrate. Then, copper phthalocyanine and α-NPD is deposited sequentially by vacuum vapor deposition over the ITO to have thicknesses of 20 nm and 40 nm, respectively.

A pyran derivative according to the present invention represented by structural formula 4, $Alq_3$, 2,3-bis(4-diphenylaminophenyl)quinoxaline (abbreviated TPAQn), and rubrene are deposited by co-evaporation over the α-NPD to have a weight ratio of 0.01:1:0.75:1, respectively in a thickness of 50 nm.

$Alq_3$ is independently deposited to have a thickness of 20 nm over the deposited film containing a pyran derivative according to the present invention by the co-evaporation. Moreover, $CaF_2$ and aluminum are sequentially deposited over the $Alq_3$ to complete a light-emitting element according to the present invention.

Figure 8A:
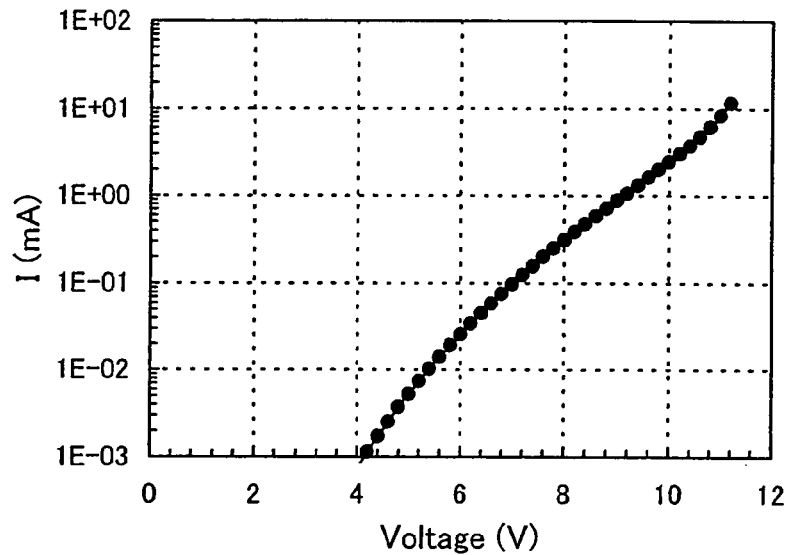
FIGS. 8A and 8B are views for showing respectively current-voltage characteristics and luminance-voltage characteristics of a light-emitting element using a pyran derivative according to certain aspects of the present invention.
Figure 8B:
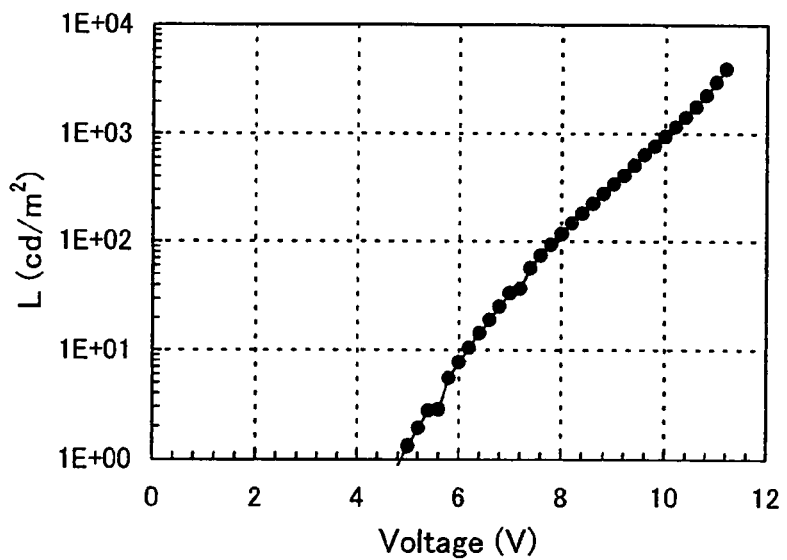
Figure 9:
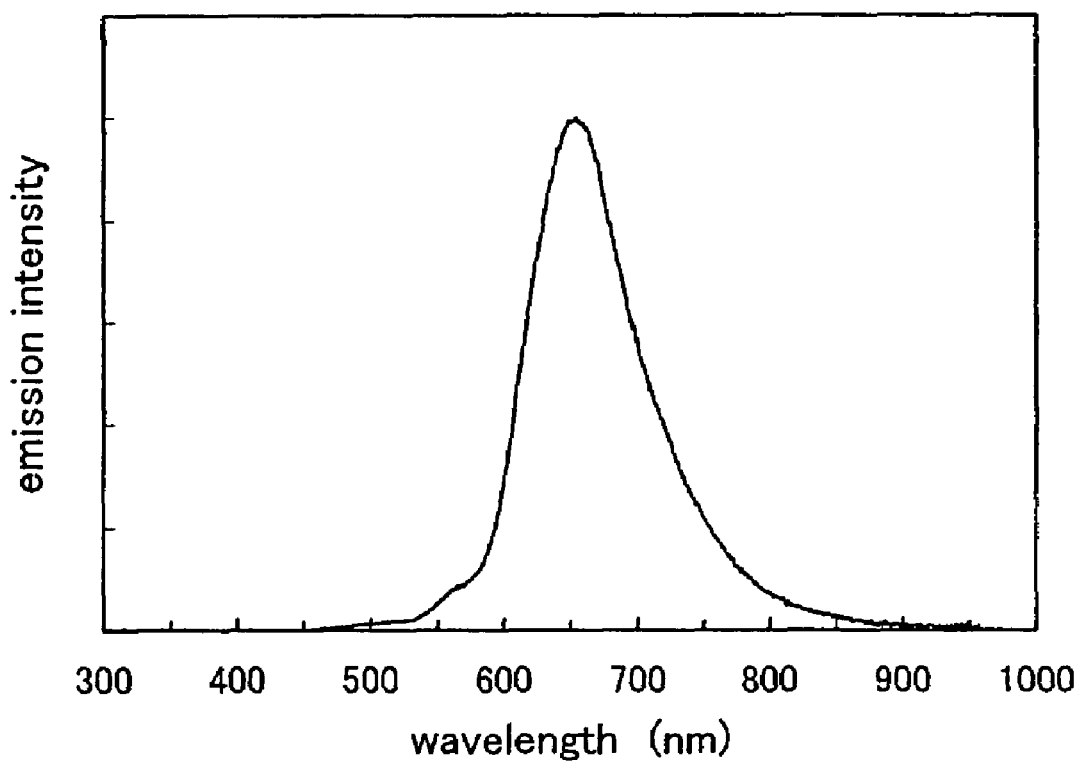
FIG. 9 is a view for showing absorption and emission spectra of a light-emitting element using a pyran derivative according to certain aspects of the present invention.

FIG. 8A shows current-voltage (I-V) characteristics and FIG. 8B shows luminance-voltage (L-V) characteristics of thus manufactured light-emitting element according to the present invention. FIG. 8B shows that approximately 5 V is required to obtain a luminance of 1 $cd/m^2$. Accordingly, it can be said that the light-emitting element operates at low voltage. The light-emitting element has CIE (x, y) coordinates (0.655, 0.340) at the luminance of approximately 100 $cd/m^2$. In other words, reddish emission was observed. FIG. 9 shows an emission spectrum of the light-emitting element. FIG. 9 shows that the light-emitting element has luminescence properties of having an emission peak at 660 nm.

Therefore, a pyran derivative according to the present invention can emit light in good color purity at low driving voltage by using in combination with TPAQn that is a substance having hole transportation properties and $Alq_3$ that is a substance having a large dipole moment (4 debye or more). The deteriorations of the above mentioned light-emitting element due to carbonization of a material are prevented as a pyran derivative according to the present invention is hardly carbonized.

EXAMPLE 3

A structure of a light-emitting device with which the present invention is practiced explained in Example 3.

In FIG. 10, a region encircled by dotted line denotes a transistor 11 for driving a light-emitting element 12. The light-emitting element 12 includes a first electrode 13, a second electrode 14, and a light-emitting layer 15 interposed between the pair of electrodes. A drain of the transistor 11 and the first electrode 13 are electrically connected with each other by a wiring 17 penetrating into a first interlayer insulating film 16 (16a, 16b, and 16c). The light-emitting element 12 is separated from other adjacent light-emitting elements by a bank layer 18. The light-emitting device according to the present invention with the above mentioned structure is provided over a substrate 10 in Example 3.

In the light-emitting device having the above mentioned structure, the light-emitting element 12 is a light-emitting element formed by using a pyran derivative according to the present invention. The light-emitting layer 15 is, as described in Embodiment 2, includes laminated layers formed by a substance having high carrier transportation properties or a substance having high carrier injection properties, and includes partly a pyran derivative according to the present invention.

Figure 11A:
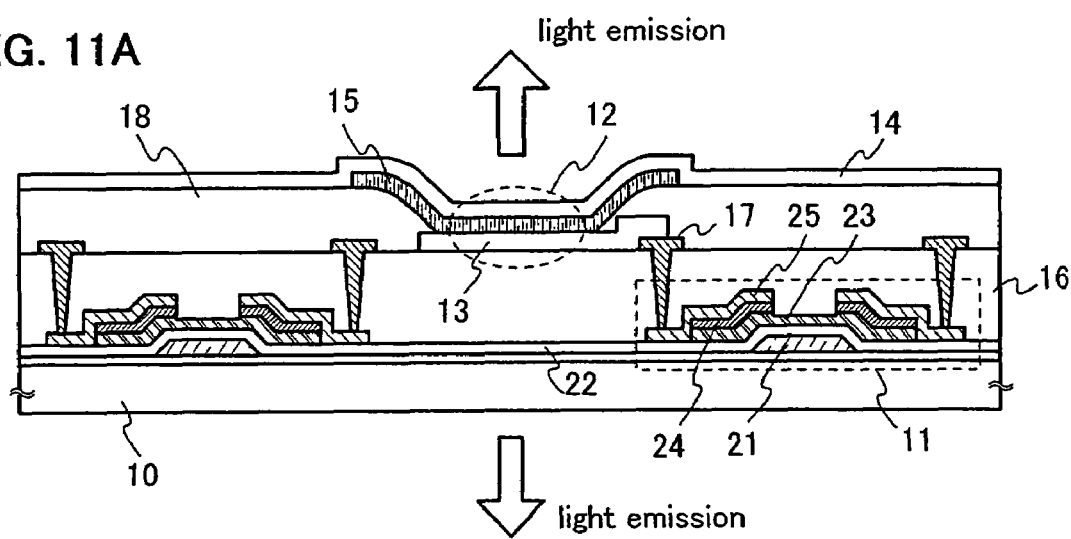
FIGS. 11A and 11B are explanatory cross-sectional views of a light-emitting device according to certain aspects of the present invention.
Figure 11B:
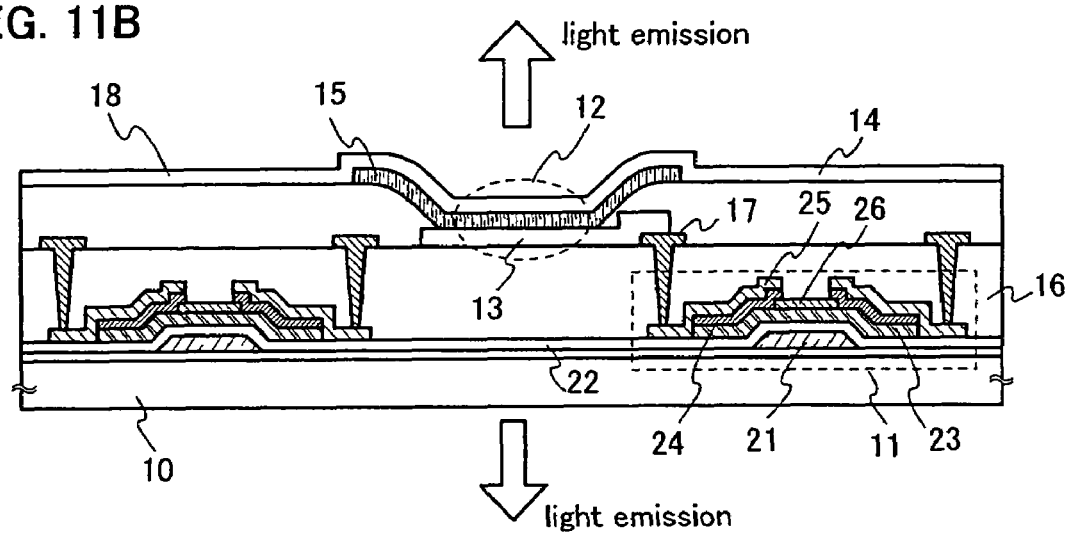

The transistor 11 is a top gate transistor. A structure of the transistor 11 is not restricted. For example, the transistor 11 may be an inversely staggered transistor as shown in FIG. 11A. In the case that the transistor 11 is an inversely staggered transistor, the transistor 11 may have the configuration in which a protective film is formed over a semiconductor layer that forms a channel (channel protecting type), or the configuration in which a part of a semiconductor layer that forms a channel is formed to have a concave shape (channel etch type). Reference numeral 21 denotes a gate electrode; 22, a gate insulating film; 23, a semiconductor layer; 24, an n-type semiconductor layer; 25, an electrode; and 26, a protective film.

A semiconductor layer for forming the transistor 11 may be either a crystalline semiconductor layer or an amorphous semiconductor layer. Alternatively, a semiamorphous semiconductor layer may be used.

The semiamorphous semiconductor has an intermediate structure between an amorphous structure and a crystalline structure (including single crystals and poly crystals). The semiamorphous semiconductor has a stable third state with respect to free energy, and a crystalline region having a short-range order and lattice distortion. At least a part of the semiconductor includes crystal grains with grain diameters of from 0.5 to 20 nm. A raman spectrum is shifted to a lower wave number than 520 $cm^{-1}$. By X-ray diffraction, diffraction peaks (111), (220) that may be derived from a Si crystalline lattice are observed. Hydrogen or halogen of at least 1 atomic % is contained the semiamorphous semiconductor as neutralizer for dangling bond. Such semiamorphous semiconductor is referred to as what is called micro crystal semiconductor. A silicide gas is used to be carried out with glow discharge decomposition (plasma CVD). As the silicide gas, $Si_2H_6$, $SiH_2Cl_2$, $SiHCl_3$, $SiC_4$, $SiF_4$, or the like in addition to $SiH_4$ can be used. The silicide gas can be diluted by $H_2$, or the $H_2$ and one or a plurality of rare gas elements selected from the group consisting of He, Ar, Kr, and Ne. The dilution rate is in the range of from 2 to 1000 times. An applied voltage is in the range of from 0.1 to 133 Pa. A power source frequency is in the range of from 1 to 120 MHz, preferably, 13 to 60 MHz. A heat temperature for a substrate is at most 300° C., preferably, 100 to 250° C. As impurity elements in the film, atmospheric constituents such as oxygen, nitrogen, carbon, and the like have preferably concentrations of at most $1\times10^{20}/cm^{-1}$, especially, oxygen concentration is at most $5\times10^{19}/cm^3$, preferably, $1\times10^{19}/cm^3$. A TFT (thin film transistor) including semiamorphous semiconductor has mobility of approximately from 1 to 10 $m^2/Vsec$.

As a specific example of a crystalline semiconductor layer, a semiconductor layer formed by a single crystalline silicon, a polycrystalline silicon, silicon germanium, or the like can be used. These semiconductor layers may be formed by laser crystallization, or crystallization by a solid phase growth method using nickel or the like.

In case that a semiconductor layer is formed by an amorphous substance, for example, amorphous silicon; a light-emitting device has preferably a circuit composed of the transistor 11 and another transistor (transistor that composes a circuit for driving a light-emitting element), each of which is formed by an N-channel type transistor. Alternatively, the light-emitting device may have a circuit including either an N-channel type transistor or a P-channel type transistor; or the light-emitting device may have a circuit including both of the N-channel type transistor and the P-channel type transistor.

Figure 10A:
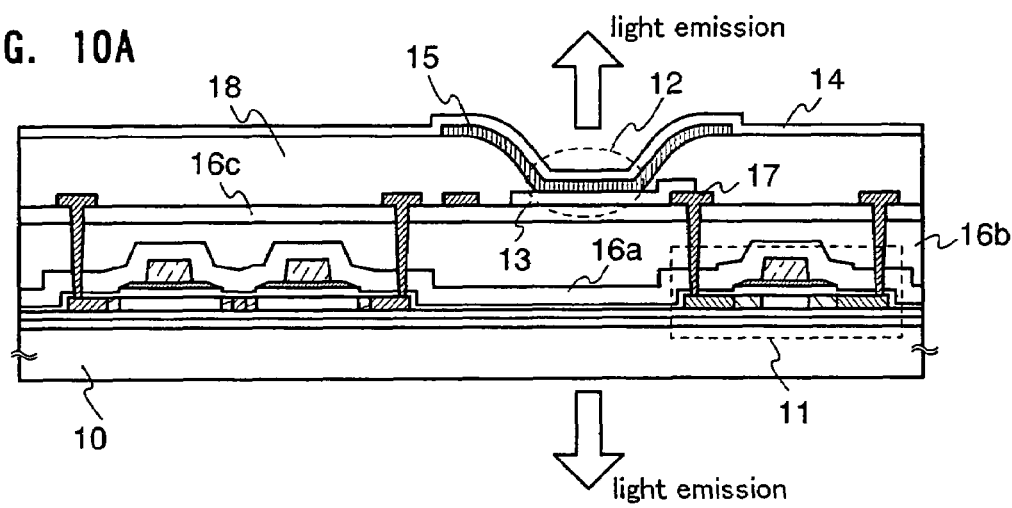
FIGS. 10A to 10C are explanatory cross-sectional views of a light-emitting device according to certain aspects of the present invention.
Figure 10B:
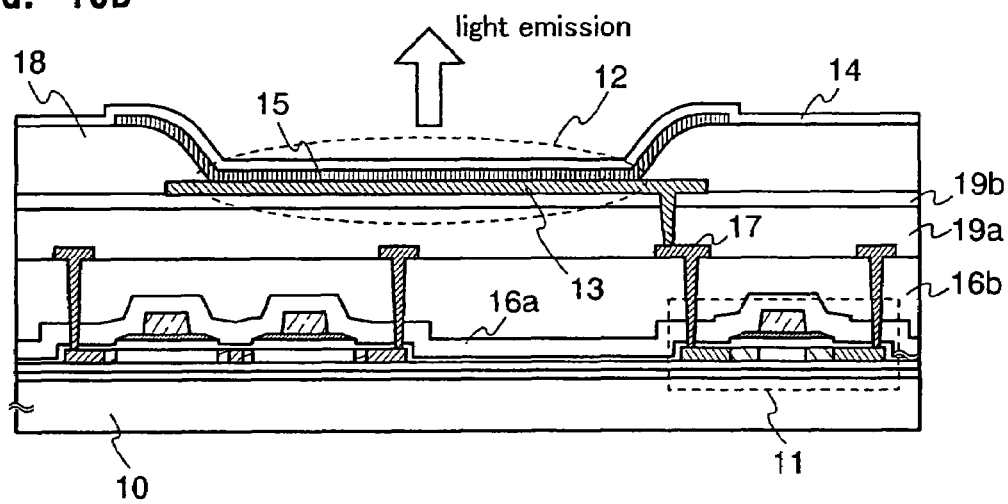
Figure 10C:
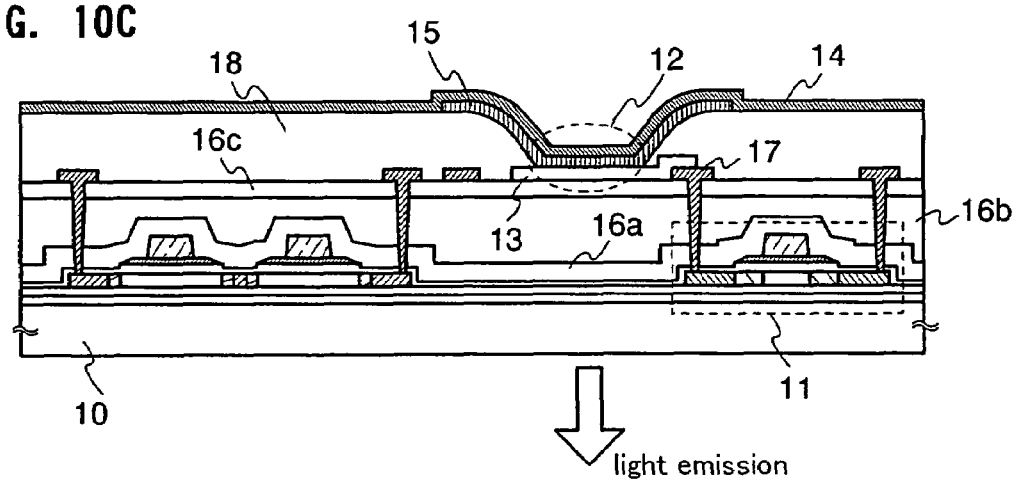

The first interlayer insulating film 16 may be either a multi-layer or a single layer as shown in FIGS. 10A and 10C. The first interlayer insulating film 16a is formed by an inorganic substance such as silicon oxide, silicon nitride, or the like. The first interlayer insulating film 16b is formed by a substance having self planarity properties such as acrylic; siloxane in which a skeleton is formed by the bond of silicon (Si) and oxygen (O), and at least hydrogen is included as a substituent; a silicon oxide capable of being a film by coating; or the like may also be used. The first interlayer insulating film 16c contains silicon nitride containing argon (Ar). A material contained in each layer is not particularly limited, but other materials beside those cited in the above can be used. As mentioned above, the first interlayer insulating film 16 may be formed by both an inorganic substance and an organic substance, or either the inorganic substance or the organic substance.

The bank layer 18 is preferably formed to have a curved edge portion whose radius of curvature is continuously varied. The bank layer 18 is formed by acrylic, siloxane, resist, silicon oxide, or the like. The bank layer 18 may be formed by either an inorganic film or an organic film, or both of them.

FIGS. 10A and 10C show that only the first interlayer insulating film 16 is provided between the transistor 11 and the light-emitting element 12. However, beside the first interlayer insulating film 16 (16a, 16b), a second interlayer insulating film 19 (19a, 19b) may be provided as shown in FIG. 10B. In a light-emitting device shown in FIG. 10B, the first electrode 13 penetrates the second interlayer insulating film 19 to be connected to the wiring 17.

The second interlayer insulating film 19 may be either a multi-layer or a single layer as well as the first interlayer insulating film 16. The second interlayer insulating film 19a is formed by a substance having self planarity properties such as acrylic; siloxane in which a skeleton is formed by the bond of silicon (Si) and oxygen (O), and at least hydrogen is included as a substituent; a silicon oxide capable of being a film by coating; or the like may also be used. The second interlayer insulating film 19b is formed by a silicon nitride film containing argon (Ar). A substance for forming each of the layer is not especially restricted, another substance may be used. A layer formed by another substance may be used in combination with the first interlayer insulating film. A material contained in each layer is not particularly limited, but other materials beside those cited in the above can be used. Also, another layer containing substances other than the above can be further formed. As mentioned above, the first interlayer insulating film 19 may be formed by both an inorganic substance and an organic substance, or either the inorganic substance or the organic substance.

In the light-emitting element 12, in the case that both the first electrode 13 and the second electrode 14 are formed by a light-transmitting material, light is emitted from both of the first electrode 13 and the second electrode 14 as indicated by an open arrow in FIG. 10A. In the case that only the second electrode 14 is formed by a light-transmitting material, light is emitted from only the second electrode 14 as indicated by an open arrow in FIG. 10B. In this instance, the first electrode 13 is preferably formed by a material having high reflectivity, alternatively, a film formed by a material having high reflectivity (a reflective film) is preferably provided at the bottom of the first electrode 13. In the case that only the first electrode 13 is formed by a light-transmitting material, light is emitted from only the first electrode 13 as indicated by an open arrow in FIG. 10C. In this instance, the second electrode 14 is preferably formed by a material having high reflectivity, alternatively, a film formed by a material having high reflectivity (a reflective film) is preferably provided at the bottom of the second electrode 14.

The light-emitting element 12 may be formed to have the structure in which the first electrode 13 serves as an anode, and the second electrode 14 serves as a cathode; or the structure in which the first electrode 13 serves as a cathode, and the second electrode 14 serves as an anode. In addition, in the case of the former, the transistor 11 is a P-channel transistor, and in the case of the latter, the transistor 11 is an N-channel transistor.

In a light-emitting device according to Example 3, a plurality of light-emitting elements are arranged in a matrix configuration (not shown). In the case that an emission wavelength of each light-emitting element is the same as that of the light-emitting element 12, a light-emitting device that gives monochromic light emission is provided. In the case that an emission wavelength of each light-emitting element is different from each other, a light-emitting device that gives full-color light emission such as red (R), green (G), blue (B), or the like is provided.

In the above mentioned light-emitting device, emission or non-emission state of the device is controlled by a transistor electrically connected to each light-emitting element. The control of emission or non-emission state of each light-emitting element enables a light-emitting device to display images or the like. By the light-emitting device, good images without inferior picture quality due to the inferior luminescent properties caused by the carbonization of light-emitting compounds can be provided.

EXAMPLE 4

Figure 12:
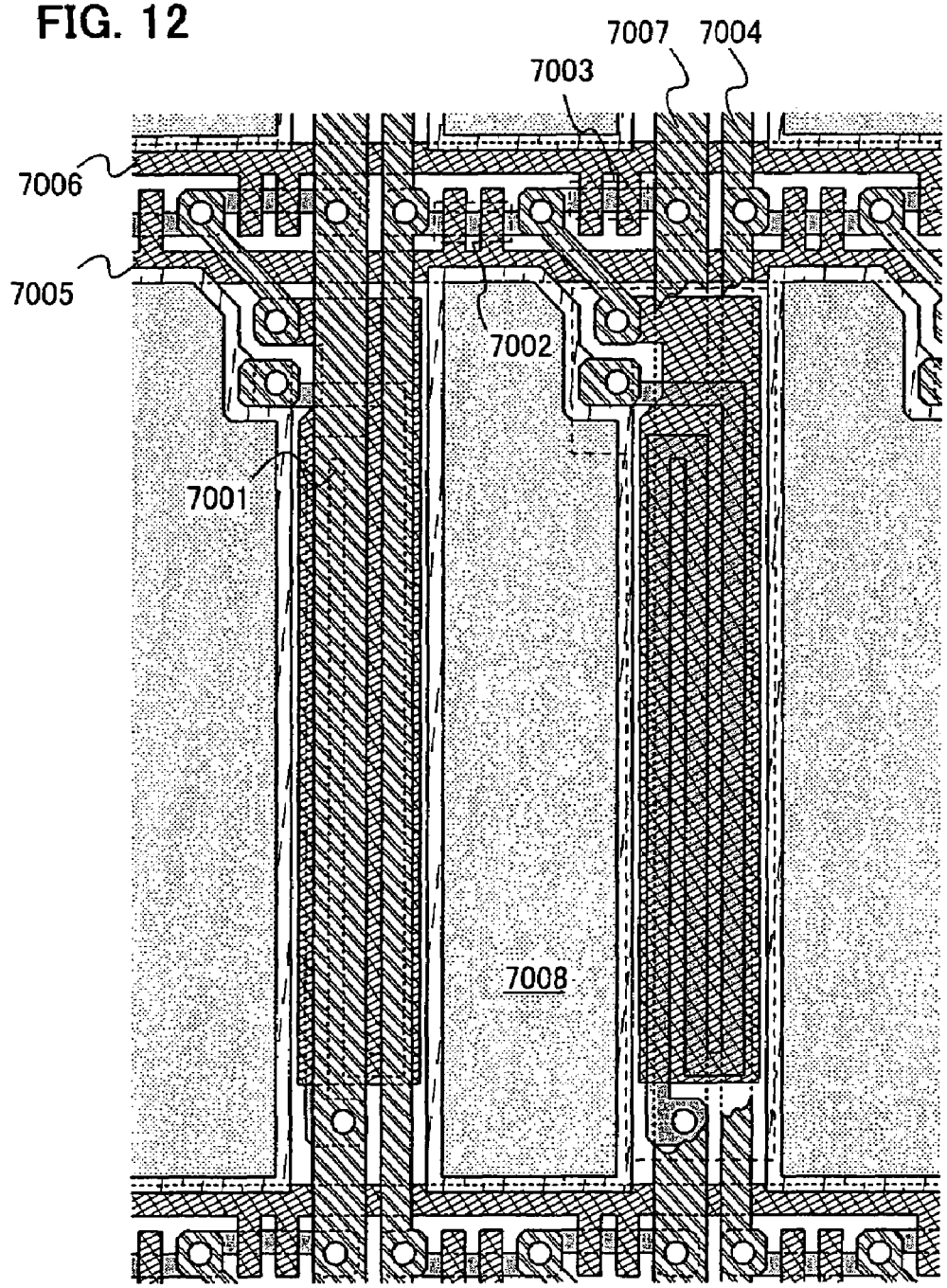
FIG. 12 is a top view of a pixel portion of a light-emitting device according to certain aspects of the present invention.
Figure 13:
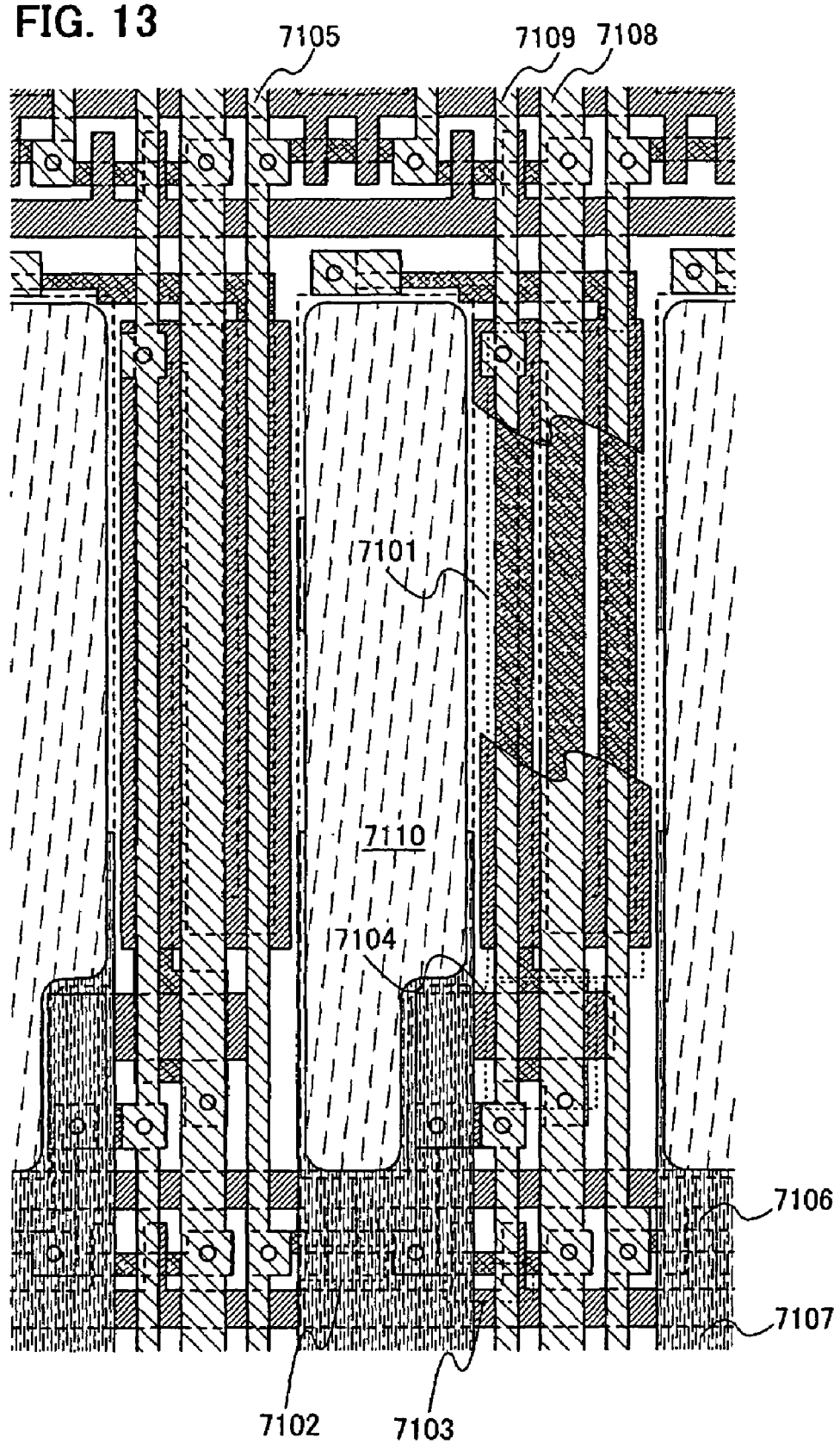
FIG. 13 is a top view of a pixel portion of a light-emitting device according to certain aspects of the present invention.

A light-emitting device according to the present invention is explained in Example 4 with reference to top views in FIGS. 12, 13, and a circuit diagram in FIG. 14.

Figure 14A:
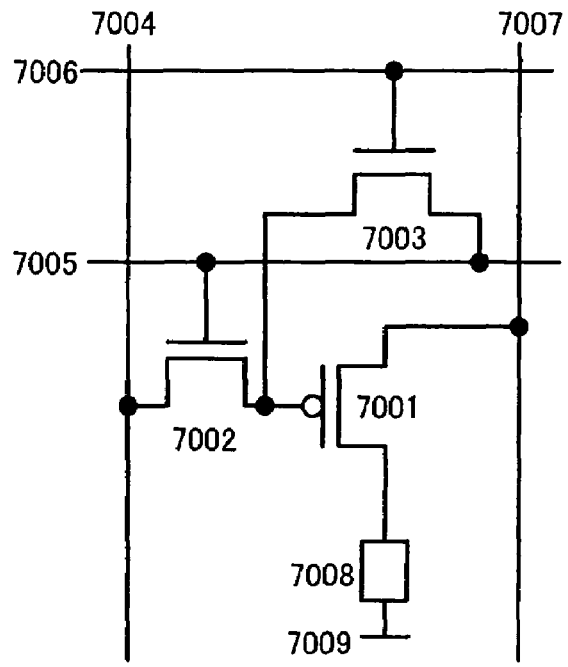
FIGS. 14A and 14B are circuit diagrams of a pixel portion of a light-emitting device.

FIG. 12 is a top view of a pixel portion of a light-emitting device having a display function. The pixel portion is provided with a light-emitting element, a drive transistor 7001 for deciding emission or non-emission state of the light-emitting element by an image signal, a switching transistor 7002 for controlling the input of the image signal, an erasing transistor 7003 for making the light-emitting element non-emission state regardless of the image signal, a source signal line 7004, a first scanning line 7005, a second scanning line 7006, and a current supply line 7007. A light-emitting element explained in Embodiment 2 is formed in the region denoted by reference numeral 7008. FIG. 14A is a drive circuit diagram of a pixel portion of a light-emitting device having a pixel portion formed to have the structure shown in FIG. 12.

During a write period, upon selecting the first scanning line 7005, the switching transistor 7002 is turned ON whose gate is connected to the first scanning line 7005. Then, a video signal inputted to the source signal line 7004 is inputted into a gate of the drive transistor 7001 via the switching transistor 7002, and then, a current is applied from the current supply line 7007 into a light-emitting element to emit light. During a holding period, the switching transistor 7002 is turned OFF by controlling an electric potential of the first scanning line 7005 to store hold an electric potential of a video signal written during the write period. During an erasing period, the erasing transistor 7003 is turned ON and the drive transistor 7001 is turned OFF by selecting the second scanning line 7006, and so it is possible to prevent forcibly a current from being supplied into the light-emitting element.

Figure 14B:
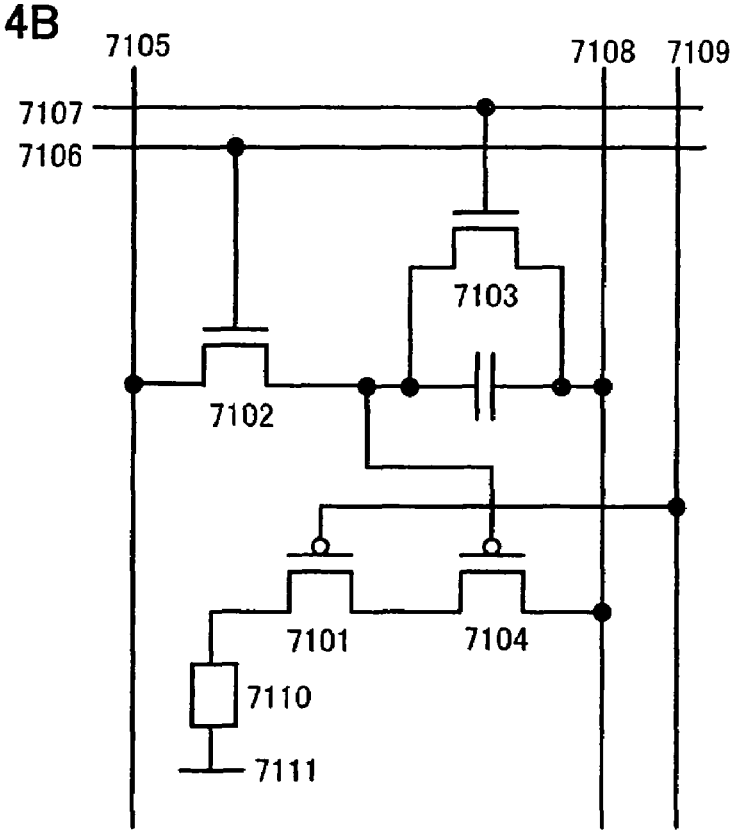

FIG. 13 is a top view of a pixel portion of a light-emitting device having a display function. The pixel portion has a circuit structure different from that shown in FIG. 12. The pixel portion is provided with a driving transistor 7101 that determines a light-emitting or non light-emitting state of the light-emitting element in accordance with the video signal, a switching transistor 7102 for controlling the input of the video signal, an erasing transistor 7103 for turning the light-emitting element non-emission state regardless of the video signal, a current control transistor 7104 for controlling a current supply into the light-emitting element, a source signal line 7105, a first scanning line 7106, a second scanning line 7107, a current supply line 7108, and a power source line 7109. A light-emitting element according to the present invention as described in Embodiment 2 is formed in a region denoted by reference numeral 7110. FIG. 14B is a drive circuit diagram of a pixel portion of a light-emitting device having a pixel portion formed into the structure shown in FIG. 13.

Upon selecting the first scanning line 7106 during a write period, the switching transistor 7102 whose gate is connected to the first scanning line 7106 is turned ON. Then, a video signal inputted to the source signal line 7105 is inputted into a gate of the current control transistor 7104 via the switching transistor 7102, a current is applied to a light-emitting element from the current supply line 7108 via the drive transistor 7101. A gate electrode of the drive transistor 7101 is connected to the power source line 7109. During a holding period, an electric potential of a first scanning line 7106 is controlled to turn OFF the switching transistor 7102 and to maintain an electric potential of a video signal written during a write period. During an erasing period, the erasing transistor 7103 is turned ON by selecting the second scanning line 7107, and the current control transistor is turned OFF. Accordingly, it is possible to prevent forcibly a current from being supplied into the light-emitting element.

Each transistor in the above described light-emitting device is not especially restricted. Each the transistor may be formed into a single gate structure, a multi gate structure, an LDD structure, or a gate overlapped LDD structure in which an LDD portion and a gate electrode are overlapped with each other.

A light-emitting device explained in Example 4 can achieve good display without inferior picture quality due to the inferior luminescent properties caused by the carbonization of light-emitting compounds. The light-emitting device is effectively used as a full color display device since a pyran derivative according to the present invention exhibits reddish emission.

EXAMPLE 5

A light-emitting device explained in Examples 3 and 4 with which the present invention is practiced is installed into various electric appliances after the installation and the sealing of an external input terminal.

An electric appliance with which the present invention is practiced can display good image without inferior picture quality due to the inferior luminescent properties caused by the carbonization of light-emitting compounds.

Figure 15:
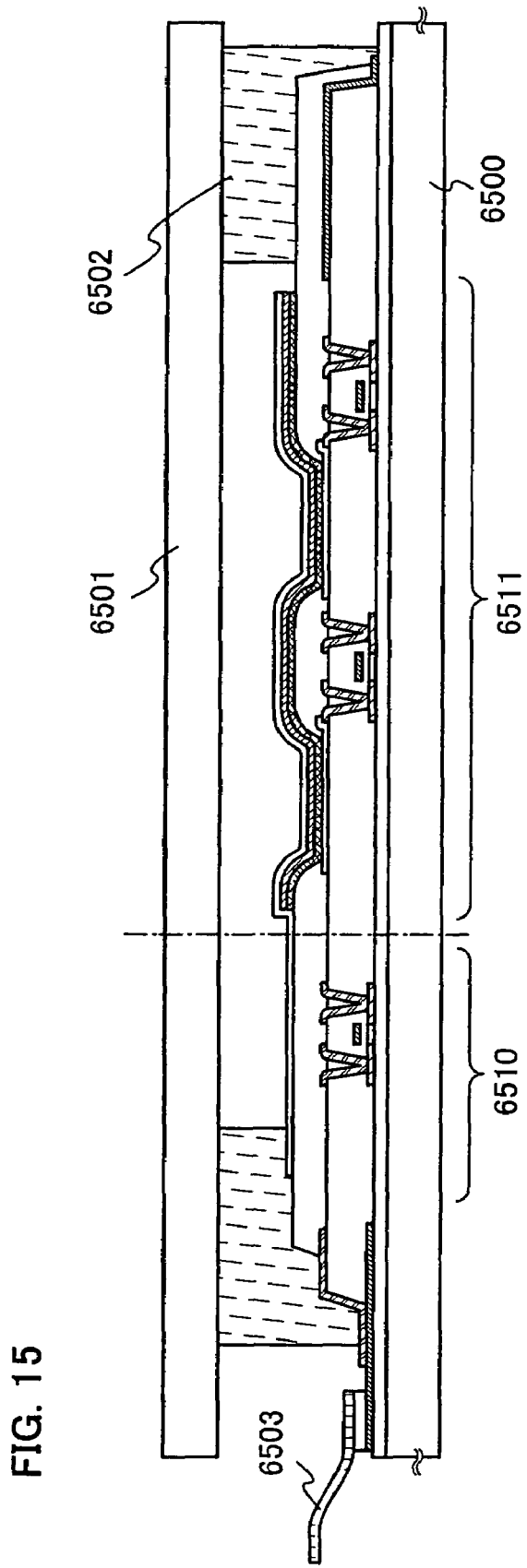
FIG. 15 is an explanatory cross-sectional view of a light-emitting device according to certain aspects of the present invention.
Figure 16:
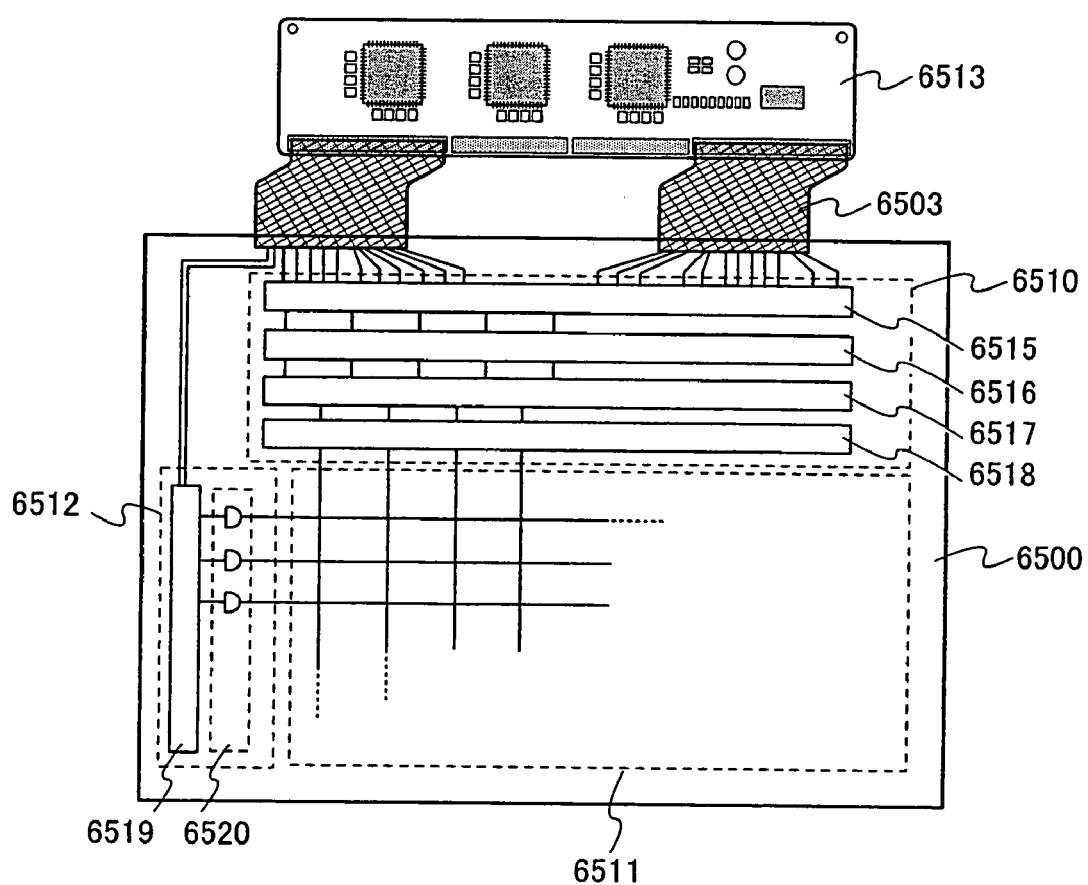
FIG. 16 is a view for showing a frame format of a light-emitting device according to certain aspects of the present invention.
Figure 17:
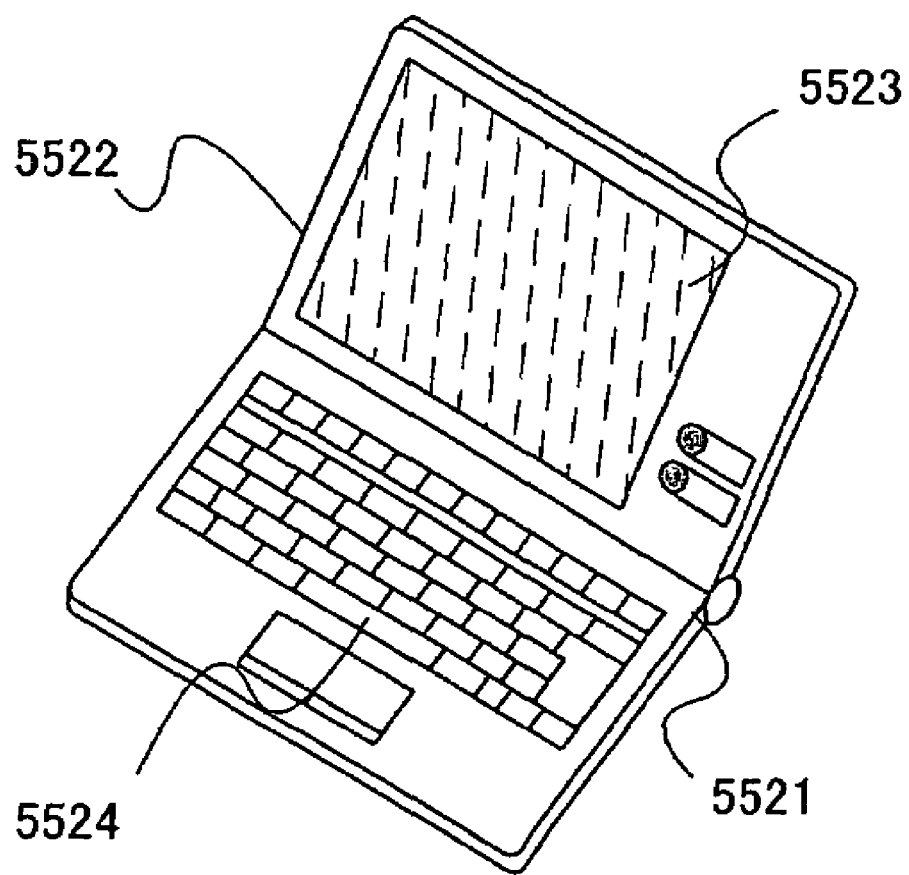
FIG. 17 is a view for showing an electronic appliance installed with a light-emitting device according to certain aspects of the present invention.

A light-emitting device and an electric appliance installed with the light-emitting device, each of which is practiced with the present invention, are explained in Example 5 with reference to FIGS. 15, 16, and 17. The light-emitting device and the electric appliance illustrated in FIGS. 15, 16, and 17 are embodiments only. The structure of the light-emitting device is not limited thereto.

FIG. 15 is a cross-sectional view of a light-emitting device after sealing. A substrate 6500 is pasted onto a sealing substrate 6501, so that a transistor and a light-emitting element according to the present invention are interposed therebetween. An FPC (flexible printed circuit) 6503 is attached to the edge portion of the substrate 6500. Space between the substrate 6500 and the sealing substrate 6501 is filled with an inert gas such as nitrogen or a resin material.

FIG. 16 is a view showing a frame format of a top surface of a light-emitting device with which the present invention is practiced. In FIG. 16, reference numeral 6510 enclosed by dotted line denotes a drive circuit portion (source side drive circuit); 6511, a pixel portion; and 6512, a drive circuit portion (gate side drive circuit). A light-emitting element according to the present invention is provided in the pixel portion 6511. The drive circuit portion 6510 and the drive circuit portion 6512 are connected each other via a wiring group formed over the FPC 6503 that is an external input terminal and the substrate 6500. Upon receiving a video signal, a clock signal, a start signal, a reset signal, or the like from the FPC 6503, a signal is inputted into the source side drive circuit 6510 and the gate side drive circuit 6512. A printed wiring board (PWB) 6513 is attached to the FPC 6503. The drive circuit portion 6510 is provided with a shift resistor 6515, a switch 6516, and memories (latches) 6517 and 6518. The drive circuit portion 6512 is provided with a shift resistor 6519, and a buffer 6520. Another function may be provided to the light-emitting device. Further, the drive circuit portion and the pixel portion are not always necessary to be provided over one substrate. For example, the drive circuit portion may be provided to the outside of the substrate by using a TCP, that is, an FPC with a wiring pattern mounted with an IC chip.

FIG. 17 is a view for showing one embodiment of an electric appliance installed with a light-emitting device with which the present invention is practiced.

FIG. 17 shows a laptop personal computer manufactured by practicing the present invention that is composed of a main body 5501, a housing 5502, a display portion 5503, a key board 5504, and the like. The display device can be completed by installing a light-emitting device having a light-emitting element according to the present invention to the laptop personal computer.

In Example 5, a laptop personal computer is explained; however, a light-emitting device having a light-emitting element according to the present invention may be installed to a cellular phone, a TV reception set, a car navigation system, a lighting device, or the like.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A light-emitting device comprising:
a substrate;
a transistor formed over the substrate;
an insulating film formed over the transistor; and
a light-emitting element formed over the insulating film, electrically connected to the transistor, and comprising a first electrode, a second electrode, and a light-emitting layer interposed therebetween,
wherein the light-emitting layer comprises a pyran derivative represented by the following general formula,

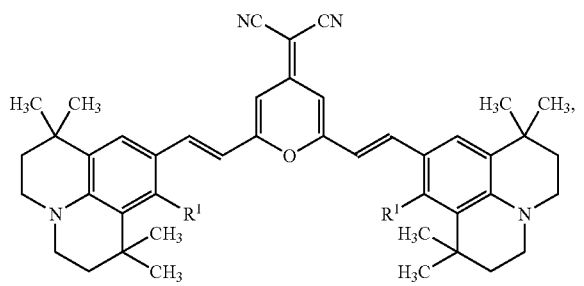

(1)

and
wherein $R^1$ is an alkoxy group.

2. The light-emitting device according to claim 1, wherein $R^1$ is a methoxy group.

3. The light-emitting device according to claim 1, wherein the light-emitting layer further comprises rubrene.

4. The light-emitting device according to claim 1, wherein the light-emitting layer further comprises tris(8-quinolinolato)aluminum or 9,10-di(2-naphtyl)anthracene.

5. An electronic appliance comprising the light-emitting device according to claim 1.

6. A light-emitting device comprising:
a substrate;
a transistor formed over the substrate;
an insulating film formed over the transistor; and
a light-emitting element formed over the insulating film, electrically connected to the transistor, and comprising a first electrode, a second electrode, and a light-emitting layer interposed therebetween,
wherein the light-emitting layer comprises a pyran derivative represented by the following general formula,

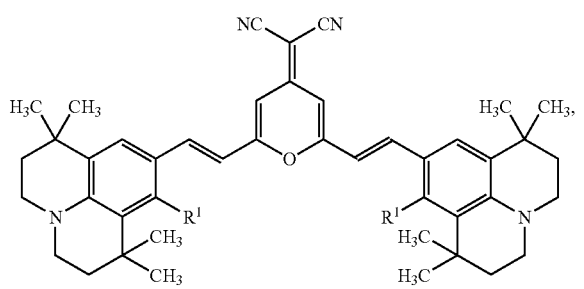

(1)

wherein $R^1$ is an alkoxy group,
wherein a temperature difference between a first temperature and a second temperature is within 100° C. when the Thermogravimetry-Differential Thermal Analysis is applied to the pyran derivative, and
wherein the first temperature is a temperature at the beginning of a weight loss in the pyran derivative, and the second temperature is a temperature at which weight of the pyran derivative reaches 50% compared to the weight at the beginning of a weight loss.

7. The light-emitting device according to claim 6, wherein $R^1$ is a methoxy group.

8. The light-emitting device according to claim 6, wherein the light-emitting layer further comprises rubrene.

9. The light-emitting device according to claim 6, wherein the light-emitting layer further comprises tris(8-quinolinolato)aluminum or 9,10-di(2-naphtyl)anthracene.

10. An electronic appliance comprising the light-emitting device according to claim 6.

11. A light-emitting device comprising:
a substrate;
a transistor formed over the substrate;
an insulating film formed over the transistor; and
a light-emitting element formed over the insulating film, electrically connected to the transistor, and comprising a first electrode, a second electrode, and a light-emitting layer interposed therebetween,
wherein the light-emitting layer comprises a first substance having a dipole moment more than 4 debye, a second substance having a hole transportation property, and a pyran derivative represented by the following general formula,

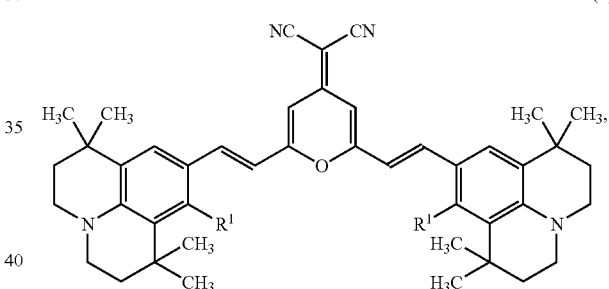

(1)

and
wherein $R^1$ is an alkoxy group.

12. The light-emitting device according to claim 11, wherein $R^1$ is a methoxy group.

13. The light-emitting device according to claim 11, wherein the light-emitting layer further comprises rubrene.

14. The light-emitting device according to claim 11, wherein the first substance having a dipole moment more than 4 debye is tris(8-quinolinolato)aluminum.

15. The light-emitting device according to claim 11, wherein the second substance having a hole transportation property is 2,3-bis(4-diphenylaminophenyl)quinoxaline.

16. An electronic appliance comprising the light-emitting device according to claim 11.

17. A light-emitting device comprising:
a substrate;
a transistor formed over the substrate;
an insulating film formed over the transistor;
a light-emitting element formed over the insulating film, electrically connected to the transistor, and comprising a first electrode, a second electrode, and a light-emitting layer interposed therebetween; and
a bank layer formed over the insulating film and covering an edge portion of the first electrode, wherein the light-emitting layer comprises a pyran derivative represented by the following general formula,

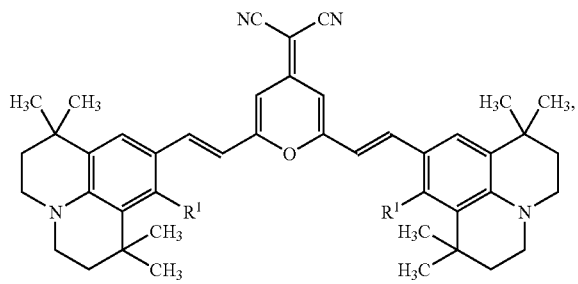

(1)

and wherein $R^1$ is an alkoxy group.

18. The light-emitting device according to claim 17, wherein $R^1$ is a methoxy group.

19. The light-emitting device according to claim 17, wherein the light-emitting layer further comprises rubrene.

20. The light-emitting device according to claim 17, wherein the light-emitting layer further comprises tris(8-quinolinolato)aluminum or 9,10-di(2-naphtyl)anthracene.

21. An electronic appliance comprising the light-emitting device according to claim 17.

* * * * *